(12) United States Patent
Ueda et al.

(10) Patent No.: US 6,844,582 B2
(45) Date of Patent: Jan. 18, 2005

(54) SEMICONDUCTOR DEVICE AND LEARNING METHOD THEREOF

(75) Inventors: Michihito Ueda, Takatsuki (JP); Kenji Toyoda, Osaka (JP); Takashi Ohtsuka, Toyonaka (JP); Kiyoyuki Morita, Yawata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/434,358

(22) Filed: May 9, 2003

(65) Prior Publication Data

US 2004/0084727 A1 May 6, 2004

(30) Foreign Application Priority Data

May 10, 2002 (JP) ........................................ 2002-134877

(51) Int. Cl.⁷ ...................... H01L 29/76; H01L 27/108; G06F 15/18; G06G 7/00
(52) U.S. Cl. .......................... 257/295; 257/296; 706/33; 706/38; 706/39
(58) Field of Search ................................ 257/347, 295, 257/296; 706/33, 38, 39

(56) References Cited

FOREIGN PATENT DOCUMENTS

| JP | 3-122756 | 5/1991 |
|----|----------|--------|
| JP | 3-226884 | 10/1991 |
| JP | 5-335506 | 12/1993 |

*Primary Examiner*—Steven Loke
(74) *Attorney, Agent, or Firm*—McDermott Will & Emery LLP

(57) ABSTRACT

A learning method of a semiconductor device of the present invention comprises a neuro device having a multiplier as a synapse in which a weight varies according to an input weight voltage, and functioning as a neural network system that processes analog data, comprising a step A of inputting predetermined input data to the neuro device and calculating an error between a target value of an output of the neuro device with respect to the input data and an actual output, a step B of calculating variation amount in the error by varying a weight of the multiplier thereafter, and a step C of varying the weight of the multiplier based on the variation amount in the error, wherein in the steps B and C, after inputting a reset voltage for setting the weight to a substantially constant value to the multiplier as the weight voltage, the weight is varied by inputting the weight voltage corresponding to the weight to be varied.

8 Claims, 16 Drawing Sheets

SEMICONDUCTOR DEVICE AND LEARNING METHOD THEREOF

BACK GROUND OF THE INVENTION

1. Field of the Invention

The present invention relates to a semiconductor device for use in neural network data processing and a learning method thereof.

2. Description of the Related Art

Development of semiconductor integrated circuit technologies has been remarkable. Various high-function logic integrated circuits have been developed as well as memories. However, these logic circuits are configured to perform operations using binary signals, and are therefore capable of very high-speed operations in simple calculation of numeric values but require enormous time to perform operations such as pattern recognition or image processing, which are relatively easy to human beings.

As devices capable of performing operations which are difficult for the conventional LSI to handle, at high speeds, neural network systems as computers that utilize data processing method in brains of animate beings, have been studied.

FIG. 18 is a view showing a device (perceptron) as a minimum unit in the neural network data processing. FIG. 19 is a view for explaining the neural network data processing (hereinafter, in specification, "neural network" is simply referred to as "NN").

In FIG. 18, 201 denotes a neuro unit which is a minimum unit that performs a basic operation of the NN data processing. The neuro unit is also called perceptron. The neuro unit is composed of two parts, i.e., synapses 203 and a neuro 205. The synapses 203 each has a function to multiply an input Xk (k: natural number) by a coefficient Wk called a weight and output the resulting signal. The neuro 205 has an addition function to add input signals output from the plurality of synapses 203, and a thresholding function to perform thresholding on an addition result.

The function of the neuro unit is represented by a formula:

$$y = f[\Sigma(k=1 \text{ to } n)(Wk \cdot Xk)] \quad (n: \text{natural number}) \quad (1)$$

where f is a threshold function such as a sigmoid function. The sigmoid function is represented by the following formula (2):

$$f(z) = 1/(1 + \exp^{-z}) \quad (2)$$

FIG. 19 is a view schematically showing a configuration for performing actual NN operation using the neuro unit in FIG. 18. FIG. 19 shows a case of 2-input and 1-output as the simplest NN operation.

As shown in FIG. 19, a layer called an intermediate layer is provided between inputs V1 and V2 and an output V0. The intermediate layer is formed by coupling of the neuro unit.

Hereinbelow, for the sake of simplicity, a neural network system with a two-stage configuration, will be described. A stage from which a final output is sent out is called an output layer, and a stage between the inputs and the output layer is called the intermediate layer.

A correlation between the inputs and the output is established by optimally setting coefficients (weights) by which the inputs are to be multiplied in multiplication in which plural types of operations are performed in each neuro unit. An operation for optimally setting the weight is called learning.

Thus, since numerous multiplications are required to carry out in the neural network system, the operation time tends to increase tremendously with increasing number of inputs.

In addition, when the intermediate layers have three or more stages, the number of operations further increases, so that the operation time becomes longer.

In order to solve the above described problem, there has been studied a neural network system configured to carry out a high-speed NN operation by carrying out simple operations such as multiplication, addition, and thresholding as an analog operation.

The conventional example of such a neural network system is a semiconductor device described below (see Japanese Patent No. 3122756).

FIG. 20 is a circuit diagram showing a configuration of the conventional neural network system. As shown in FIG. 20, the conventional neural network system comprises a P-channel type MIS transistor (hereinafter simply referred to as "PMIS") 222 and a N-channel type MIS transistor (hereinafter simply referred to as "NMIS") 221 which are connected to each other, and a neuron circuit 227 connected to the PMIS 222 and the NMIS 221. The NMIS 221 has a floating gate 213 connected to a charge injecting power supply 216. Here, the PMIS 222, the NMIS 221, and the charge injecting power supply 216 correspond to the synapses 203 in FIG. 18 and the neuron circuit 227 corresponds to the neuro 205 in FIG. 18.

In the conventional neural network system, a voltage is input to a gate electrode of the MIS transistor through a plurality of capacitors, thereby carrying out addition in analog, while the thresholding is represented by using a gate voltage-drain current property (VG-ID property) of the MIS. Further, since a threshold of the NMIS 221 varies depending on presence/absence of charge injected into the floating gate 213, a gate voltage at which the NMIS 221 become a conduction state can be varied. Thereby, weighting in operation is performed.

FIG. 21 is a view showing a neuron MISFET (hereinafter this device is referred to as v MIS) as the conventional neuron circuit. Input terminals 218a to 218d of the neuron circuit 227 serve as input terminals of the vMIS 227 in FIG. 21, in which addition and thresholding are performed.

Meanwhile, as a learning method of such NN operation, for example, a backpropagation method (hereinafter referred to as BP method) is widely known.

The BP method is used when there are desired values (teaching value Tk or a target weight) for a certain operation, and learning is conducted in the following procedure.

(a) The NN operation is performed to obtain an output (forward operation).

(b) An error Ep between an output value Ok and the teaching value Tk is calculated.

(c) A weight is corrected to reduce the error Ep (backward operation).

By repeating the above steps (a) to (c), a weight for performing optimal operation is derived. Correction of the weight is accomplished for each synapse, but the weight of synapse which more affects the error is more greatly corrected. In the neural network system, a multiplier is used as a device having a function of the synapse.

As should be appreciated, when the threshold function or the output of each neuro is known, efficient operation becomes possible by using the BP method.

When the operation by the BP method is performed in software, these variables are easily recalled and referred to in calculation. But, when this operation is performed in hardware, it is necessary to detect an output value of the intermediate layer by, for example, extending wires from the intermediate layer, in order to obtain the output of the intermediate layer. When the number of neurons in the intermediate layer is large, an occupied area of the wires are disadvantageous in terms of cost, and is considered to be a cause of an unstable operation in the analog operation.

Regarding the threshold function, since the electric property of the device configuring hardware deviates from a theoretical value, a learning control routine is applied as a somewhat approximate function. It is considered that such approximation might produce negative effects such as reduction of learning efficiency, or in worst case, makes the learning operation diverge.

In order to solve the above problem, a learning control method that carries out the BP method without obtaining the output of the intermediate layer is disclosed in Japanese Laid-Open Patent Application Publication No. Hei. 3-226884 "analog neural network learning system."

In this conventional example, it is advantageous that the BP method can be applied even when the output of the intermediate layer is not known, by actually varying the weight slightly and by correcting the weight in the BP method based on a variation in the output at that time. It is also advantageous that even when the threshold function is unclear (or the threshold function cannot be described as a function), the BP method can be applied by varying the output, and can deal with variation in a threshold device flexibly.

According to the above two conventional examples, the neural network system is capable of carrying out a high-speed operation as hardware of analog. Further, regarding learning, convergence to an optimal weight becomes possible based on only outputs from the neural network system, regardless of threshold property of the device.

However, in the multiplier used in the neural network system in Japanese Patent No. 3122756, since the weight is varied using a tunnel current of a very thin insulating film, an operation is unfavorably slow. While time as long as approximately several ten msec is required to inject charge to the floating gate, the operation is performed in numerous number of times to slightly vary the weight in learning, and hence, it is difficult to reduce the operation time to be sufficient for practical use.

In addition, in the above neural network system, it is difficult to set a plurality of weights with good controllability.

FIG. 22 is a view showing the relationship between an applied voltage and a tunnel current in the floating gate of the conventional multiplier. As shown in FIG. 22, because the tunnel current increases exponentially relative to the applied voltage, it has been difficult to control the amount of charge to be injected into the floating electrode of the multiplier. As a result, in the conventional neural network system, the number of gradations of the coefficient (weight) for multiplication has been limited.

According to the learning operation method of the neural network system disclosed in Japanese Laid-Open Patent Application Publication No. Hei. 3-226884, when the weight is slightly varied or varied into a proper value, efficient learning is possible if the device property is ideal, but convergence of learning is not reliable when an actual device is non-linear or has hysteresis.

SUMMARY OF THE INVENTION

An object of the present invention is to provide a semiconductor device that functions as a neural network system having high reliability in learning and an operation speed satisfactory for practical use, and a learning method thereof.

In order to achieve this object, the inventors of the invention conceived improvement of a multiplier for the purpose of practical use of the neural network system. This is based on the concept that, since an operation speed of the multiplier for use in the prior art is insufficient, and the number of the multipliers is the largest, among devices configuring the neural network system, it is considered that improvement of performance of the multiplier greatly contributes to improvement of performance of the neural network system.

Accordingly, the inventors have found that, by applying a non-volatile multi-valued memory technology to the multiplier, addition of plural weights and improvement of an operation speed of the multiplier are accomplished. A ferroelectric memory or a phase-change memory is capable of storing data of binary or more, and write times of both of them are 100 nsec or less. Therefore, by applying such a multi-valued memory to the multiplier, speed of weight modulation can be improved significantly in contrast with the conventional multiplier.

To be specific, a semiconductor device and a learning method thereof of the present invention, comprising a neuro device having a multiplier as a synapse in which a weight varies according to an input weight voltage, and functioning as a neural network system that processes analog data, comprises: a step A of inputting predetermined input data to the neuro device and calculating an error between a target value of an output of the neuro device with respect to the input data and an actual output; a step B of calculating variation amount in the error by varying the weight of the multiplier thereafter; and a step C of varying the weight of the multiplier based on the variation amount in the error, wherein in the steps B and C, after inputting a reset voltage for setting the weight to a substantially constant value to the multiplier as the weight voltage, the weight is varied by inputting the weight voltage corresponding to the weight to be varied. In this configuration, by inputting the reset voltage to the multiplier, the weight is set to a substantially constant value. Therefore, even when the weight of the multiplier has a property affected by a previous history of the weight voltage, the weight can be set properly. As a result, reliability of learning can be improved.

It is preferable that an absolute value of the weight voltage corresponding to the weight to be varied is smaller than an absolute value of the reset voltage. In this configuration, when the weight has hysteresis characteristic with respect to the weight voltage, the weight can be optimized efficiently.

A waveform of the reset voltage may be pulse-shaped.

The steps A to C may be carried out for a multiplier different from the multiplier.

The steps A to C may be carried out for each multiplier in such a manner that the steps A to C are sequentially repeated, until the error becomes below a predetermined value.

Variation in the weight of the multiplier with respect to the weight voltage may have hysteresis characteristic. In this configuration, the present invention produces remarkable effects.

It is preferable that an absolute value of the reset voltage is larger than an absolute value of a saturation voltage in the hysteresis characteristic. By inputting the weight voltage having the absolute value larger than that of the saturation voltage, the weight is uniquely determined. Therefore, in this configuration, the reset voltage can be set properly.

The multiplier may have ferroelectric capacitor in which the weight voltage is applied to one electrode thereof, and the weight may be determined according to a potential of the other electrode of the ferroelectric capacitor.

The multiplier may have a resistance variable material in which crystalline state varies by application of the weight voltage, and the weight may be determined according to variation in the crystalline state.

The resistance variable material may become substantially amorphous state by application of the reset voltage. In this configuration, since the crystalline state of the resistance variable material is determined uniquely with respect to the weight voltage applied after application of the reset voltage, the weight can be set properly.

A semiconductor device and a learning method thereof of the present invention comprising a neuro device having a plurality of multipliers as synapses in which weights vary so as to have hysteresis characteristic with respect to an input weight voltage, and functioning as a neural network system that processes analog data, comprises a step A of inputting predetermined input data to the neuro device and causing learning to converge so that an error between a target value of an output of the neuro device with respect to the input data and an actual output becomes a predetermined value or less without inputting a reset voltage for setting the weight to a substantially constant value to the multiplier as the weight voltage; and a step B of selecting only one of the plurality of multipliers and inputting the reset voltage to the selected multiplier as the weight voltage while maintaining weights in unselected multipliers, and then inputting a weight voltage for search with the reset voltage varied by a predetermined voltage to the selected multiplier and obtaining a pair of the error and the weight voltage for search at that time, after the step A. In this configuration, the number of times the reset voltage is applied can be reduced.

The reset voltage and the weight voltage for search in the step B may be pulse-shaped, the method may further comprise a step C of, when the error obtained in the step B exceeds a final error obtained in the step A, inputting the reset voltage to the selected multiplier as the weight voltage, and then inputting a weight voltage for search obtained by varying the weight voltage for search by a voltage within a predetermined range to the selected multiplier and obtaining a pair of the error and the varied weight voltage for search at that time.

The step C may be repeated while varying the weight voltage for search according to a predetermined rule in each step until the error obtained in the each step becomes below a final error obtained in step A.

The weight voltage for search may vary stepwisely as a step subsequent to the step B proceeds.

The reset voltage may be negative and the weight voltage for search may increase by the voltage within the predetermined range in each step.

The reset voltage may be positive and the weight voltage for search may decrease by the voltage within the predetermined range in each step.

The step B may include, after the step A, a step D of selecting only one of the plurality of multipliers and inputting the reset voltage to the selected multiplier as the reset voltage while maintaining weights in unselected multipliers, and then obtaining a weight voltage at which the error becomes minimum under a condition in which the weight voltage is applied to the selected multiplier such that the weight voltage is varied continuously in a direction to reverse polarity from the reset voltage; and a step E of inputting the reset voltage to the selected multiplier as the weight voltage, and then inputting a pulse-shaped weight voltage for search comprised of the weight voltage at which the error becomes minimum to the selected multiplier and obtaining a pair of the error and the weight voltage for search at that time; the semiconductor device and the learning method thereof, may further comprise: a step F of, when the error obtained in the step E exceeds a minimum error obtained in the step D, inputting the reset voltage to the selected multiplier as the weight voltage, and then inputting a weight voltage for search obtained by varying the weight voltage for search by a voltage within a predetermined range to the selected multiplier and obtaining a pair of the error and the varied weight voltage for search at that time. In this configuration, the number of times the reset voltage is applied, can be further reduced.

The semiconductor device and the learning method may further comprise a step G of inputting the reset voltage to the selected multiplier as the weight voltage, and then inputting the weight voltage for search obtained by varying the weight voltage for search in a previous step by the voltage within the predetermined range to the selected multiplier and obtaining a pair of the error and the varied weight voltage for search at that time, and the step G may be repeated until the error obtained in the step G becomes below a final error obtained in the step A.

The weight voltage for search may vary stepwisely in a direction in which the weight voltage is varied continuously in the step D as a step subsequent to the step E proceeds.

The above and further objects and features of the invention will more fully be apparent from the following detailed description with accompanying drawings.

DETAILED DESCRIPTION OF THE PREFERRED EMBODIMENTS

Hereinafter, preferred embodiments of the present invention will be described with reference the drawings.
(First Embodiment)

Figure 1:
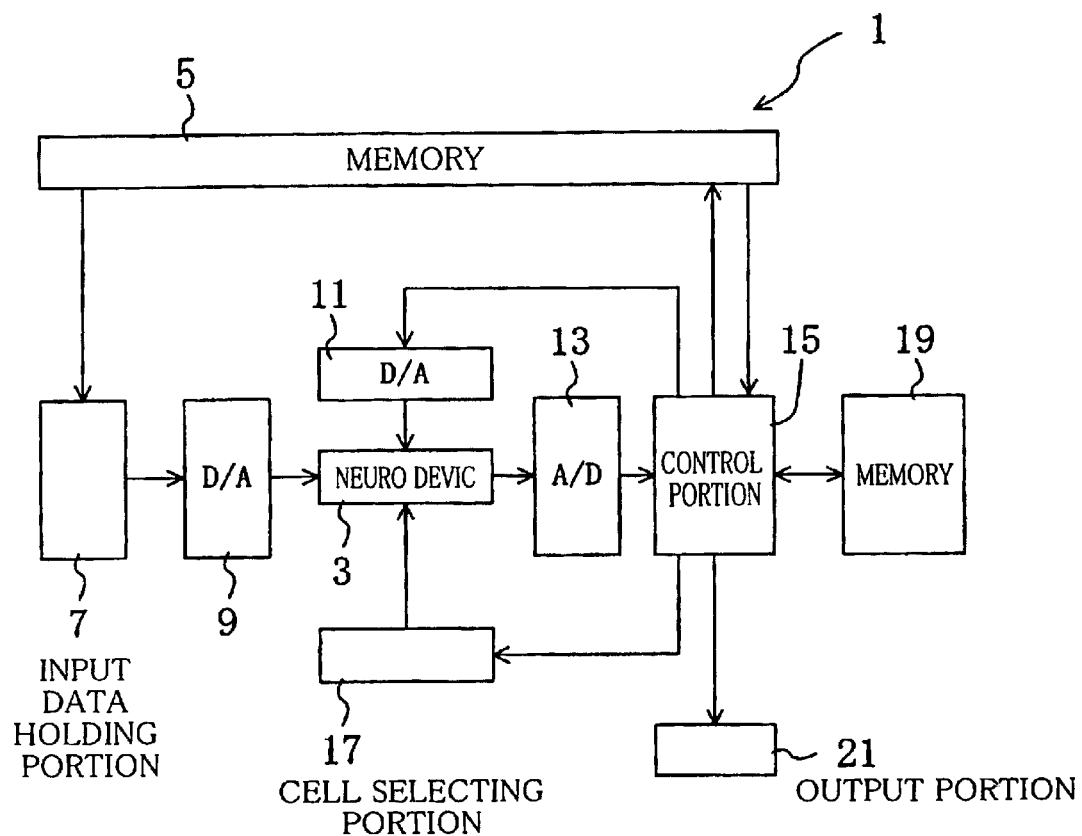
FIG. 1 is a block diagram showing a configuration of a neural network system according to a first embodiment of the present invention.

FIG. 1 is a block diagram showing a configuration of a neural network system according to a first embodiment of the present invention.

As shown in FIG. 1, a neural network system 1 of this embodiment comprises a memory 5 that stores data composed of digital data for use in NN data processing, such as an input/output pattern, an input data holding portion 7 that holds data read out from the memory 5 and outputs the data as input data, a D/A converter 9 that converts (hereinafter referred to as D/A converts) digital data output from the input data holding portion 7 into analog data and inputs the analog data to a neuro device 3, the neuro device 3 that performs NN data processing on analog input data output from the D/A converter 9, an A/D converter 13 that converts (hereinafter referred to as D/A converts) analog output data output from the neuro device 3 into digital data, a control portion 15 for performing various types of controls including a control of a learning operation of the neuro device 3 using output data of the neuro device 3 which is output in digital form from the A/D converter 13, a D/A converter 11 that D/A converts an error mentioned later which is output from the control portion 15 and inputs the error to the neuro device 3, a cell selecting portion 17 that selects a synapse to which the error within the neuro device 3 is to be written, based on a control signal from the control portion 15, a memory 19 that stores data such as an operation result in the control portion 15, and an output portion 21 that outputs a NN data processing result sent out from the neuro device 3 under the condition in which a learning operation by the control portion 15 is completed. The control portion 15 is comprised of an operation element such as a CPU and is configured to execute the above control according to control programs stored in storage means such as the memory 5 and the memory 19.

In this embodiment, the input data is stored in the memory 5 as vectors of digital data with feature quantity represented by numeric values within a range of 0 to 1. In the memory 5, teaching values are stored.

In the neural network system 1 configured as described above, in the learning operation, first of all, a signal in accordance with which the input/output pattern is selected is output from the control portion 15 to the memory 5, and the selected input/output pattern is output from the memory 5 to the input data holding portion 7 as input data.

Then, this input data is converted into analog data by the D/A converter 9 and input to the neuro device 3. The neuro device 3 performs NN data processing on the input data and outputs the processed data to the control portion 15 through the AID converter 13.

The control portion 15 calculates an error between the output from the neuro device 3 and the teaching value read out from the memory 5, and calculates a new weight for each synapse based on the error. Based on the result, the cell selecting portion 17 selects a predetermined synapse within the neuro device 3 and places it into a write enable state.

Then, when the predetermined synapse becomes the write enable state, the new weight is sent from the control portion 15 to the neuro device 3 through the D/A converter 11. Thereby, in the neuro device 3, the weight of the predetermined synapse is rewritten to the new weight.

Then, the signal in accordance with which the input/output pattern is selected is output from the control portion 15 to the memory 5. Thereafter, the input data is output from the memory 5 to the input data holding portion 7, and in the same manner as described above, the neuro device 3 re-performs NN data processing.

And, the processed data is input from the neuro device 3 to the control portion 15 through the A/D converter 13. The control portion 15 sends out this processed data to the memory 19. The memory 19 holds this. When weights of all the synapses in the neuro device 3 are optimized (the error becomes a predetermined value or less) by repeating the above described operation, the learning operation is completed.

Meanwhile, in a normal control operation, the input data selected by the control portion 15 and output from the memory 5 to the data holding portion 7, is input to the neuro device 3 through the D/A converter 11, and therein, the data is subjected to the NN data processing. Then, the processed data is sent out to the output portion 21 through the A/D converter 13 and the control portion 15, and output externally from the output portion 21.

Subsequently, a configuration of the neuro device 3 will be described.

Figure 2:
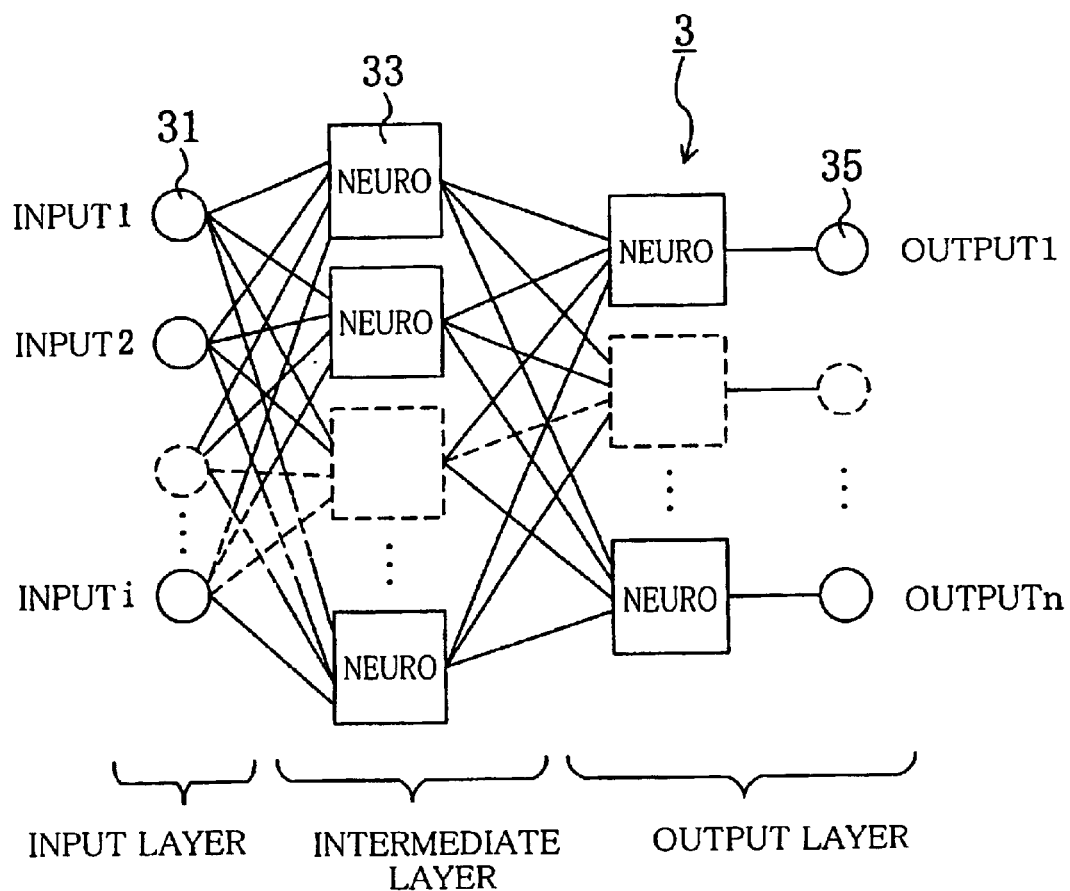
FIG. 2 is a schematic view showing a configuration of a neuro device in the neural network system of the present invention.

FIG. 2 is a schematic view showing an example of the configuration of the neuro device 3 in the neural network system in FIG. 1.

As shown in FIG. 2, the neuro device 3 is roughly comprised of an input layer, an intermediate layer, and an output layer 3. The input layer is comprised of a number of input terminals 31, and each of the input terminals 31 is connected to a plurality of neuro units 33. The intermediate layer is comprised of a number of neuro units 33. The neuro units 33 composing the intermediate layer are each connected to a plurality of neuro units 33 arranged within the output layer, and the neuro units 33 within the output layer are connected to output terminals 35 within the same output layer, respectively.

Figure 3:
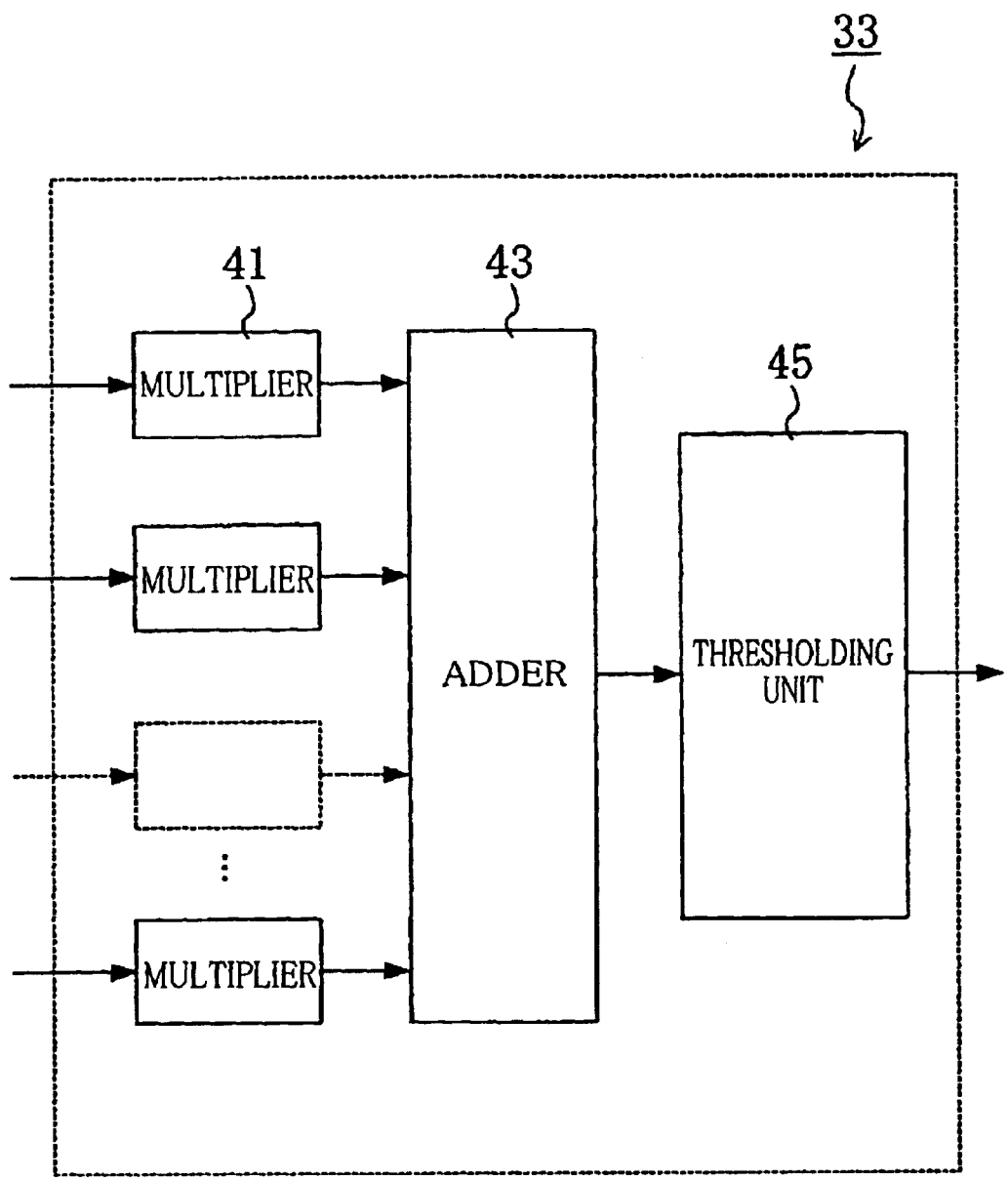
FIG. 3 is a view showing a configuration of a neuro unit in the neural network system according to the first embodiment of the present invention.
Figure 21:
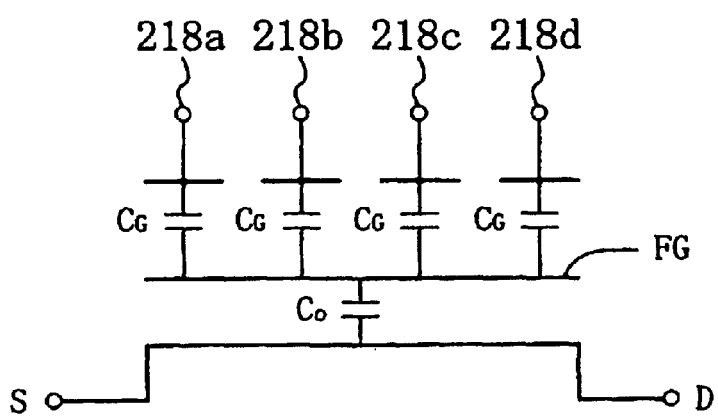
FIG. 21 is a view showing a neuron MISEFT in the conventional neuron circuit.
Figure 22:
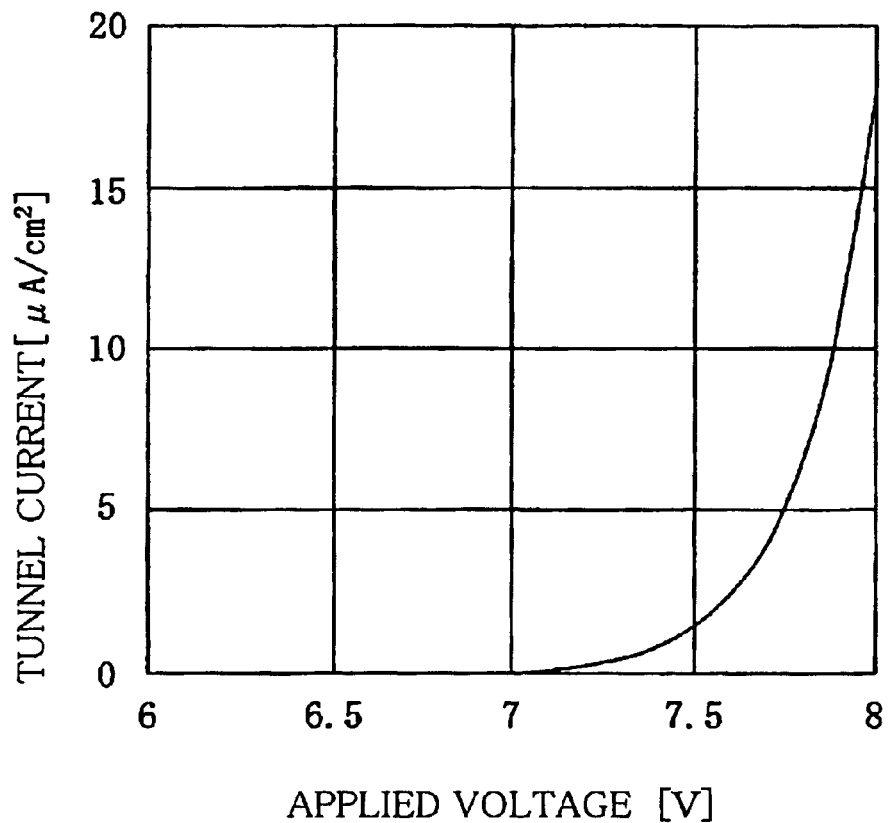
FIG. 22 is a view showing the relationship between an applied voltage and a tunnel current in a floating gate in the conventional multiplier.

FIG. 3 is a view showing a configuration of the neuro unit 33 in the neural network system of this embodiment. As shown in FIG. 3, the neuro unit 33 comprises a number of multipliers 41, an adder 43 that adds outputs from the number of multipliers 41 (more precisely, obtains a value proportional to a sum of the outputs), and a thresholding unit 45. The multipliers 41 constitute the synapses, and the adder 43 and the thresholding unit 45 constitute neuro. The thresholding unit 45 performs thresholding on the output from the adder 43 and has an input-output characteristic in which an output rapidly changes with respect to an input around a predetermined threshold. It should be noted that the adder 43 and the thresholding unit 45 are comprised of vMIS in FIG. 21, as in the prior art. The multiplier 41 has a function to multiply an input signal by a weight and output the signal. Further, the multiplier 41 has a weight holding portion that is not shown and is capable of varying a weight.

In the neuro unit 33 configured as described above, the multipliers 41 multiply a plurality of input data by weights, the adder 43 adds the data, and the thresholding unit 45 performs thresholding on the data and outputs the data. In addition, as described later, the weights of the multipliers 41 are varied by the weight holding portion.

In the neural network system of the present invention, the multipliers 41 have a feature. Hereinafter, the multipliers 41 will be described.

Figure 4:
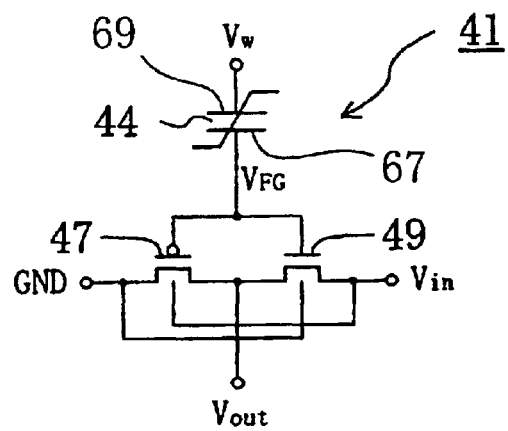
FIG. 4 is a circuit diagram showing a configuration of a multiplier for use in the neural network system according to the first embodiment of the present invention.

FIG. 4 is a circuit diagram showing a configuration of the multiplier 41 for use in the neural network system of this embodiment.

As shown in FIG. 4, in the multiplier 41 of this embodiment, ferroelectric capacitor 44 is connected to a common gate electrode of a source follower circuit comprised of a N-channel type MIS transistor (NMIS) 49 and a P-channel type MIS transistor (PMIS)47. As defined herein, the source follower circuit refers to a circuit in which a source of the PMIS 47 and a source of the NMIS 49 are connected to each other and a drain voltage of the NMIS 49 is set higher than a drain voltage of the PMIS 47. In the multiplier 41 of this embodiment, a substrate region of the PMIS 47 and a drain of the NMIS 49 are set at equipotential, and a substrate region of the NMIS 49 and a drain of the PMIS 47 are set at equipotential.

In the multiplier 41 of this embodiment, a weight voltage $V_w$ is applied to an upper electrode of the ferroelectric capacitor 44 in the form of pulse. As a result, charge caused by polarization of the ferroelectric is held in an electrode of the ferroelectric capacitor 44 which is connected to the gate electrode of the PMIS 47 and the gate electrode of the NMIS 49 (hereinafter referred to as a floating electrode or a FG electrode), thereby generating a potential (hereinafter referred to as a FG voltage) $V_{FG}$. At this time, for example, by causing the drain of the PMIS 47 to be electrically grounded and by inputting an input voltage Vin to the drain of the NMIS 49, an output voltage $V_{out}$ determined by the FG voltage $V_{FG}$ and the input voltage Vin is output. The relationship among the FG voltage $V_{FG}$, the input voltage Vin and the output voltage $V_{out}$ will be described in detail later. In the multiplier of this embodiment, the weight is set by polarization of ferroelectric, thereby achieving a multiplier capable of high-speed weight modulation.

Subsequently, a configuration of the multiplier of this embodiment will be described.

Figure 5:
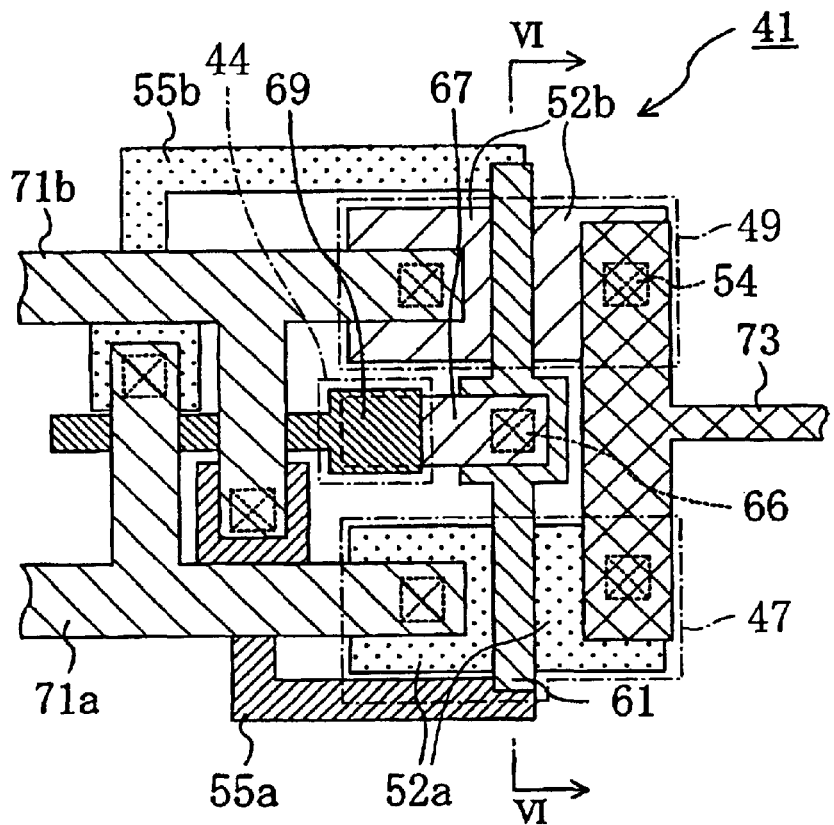
FIG. 5 is a plan view showing the multiplier according to the first embodiment as seen from above.
Figure 6:
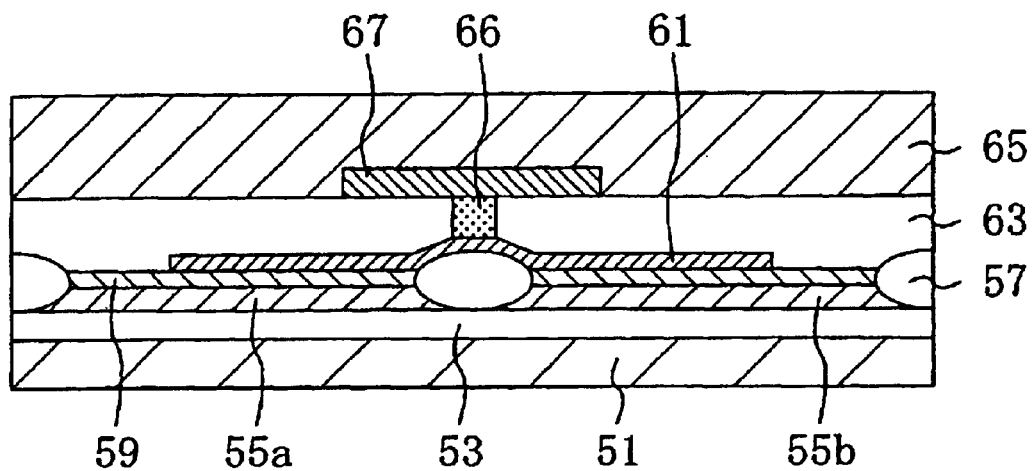
FIG. 6 is a cross-sectional view taken along line VI—VI in FIG. 5.

FIG. 5 is a plan view of the multiplier 41 of this embodiment as seen from above, and FIG. 6 is a cross-sectional view taken along line VI—VI in FIG. 5. In FIGS. 5 and 6, for easier understanding of the Figures, part of hidden lines are omitted. In FIGS. 5 and 6, the same reference numerals as those in FIGS. 3 and 4 denote the same or corresponding parts, which will not be further described.

As shown in FIGS. 5 and 6, a SOI (Silicon On Insulator) substrate is used for the multiplier of this embodiment. The SOI substrate comprises a semiconductor substrate 51 made of Si or the like and having an active region, an embedded insulating film 53 embedded in the semiconductor substrate 51 and made of, for example, silicon oxide, and an isolation insulating film 57 provided on the embedded insulating film 53 so as to surround the active region.

The PMIS 47 has a N-type semiconductor region 55a provided on the active region of the semiconductor substrate 51, a gate insulating film 59 provided on the N-type semiconductor region 55a and made of silicon oxide having a thickness of approximately 9 nm, a gate electrode 61 provided on the gate insulating film 59 and made of polysilicon, and P-type source and drain 52a provided in regions of the N-type semiconductor region 55a which are located on both sides of the gate electrode 61 as seen in a plan view so as to contain a p-type impurity.

The NMIS 49 has a P-type semiconductor region 55b provided on the active region of the semiconductor substrate 51, the gate insulating film 59 provided on the P-type semiconductor region 55b, the gate electrode 61 provided on the gate insulating film 59 to be common to the gate electrode 61 of the PMIS 47, N-type source and drain regions 52b provided on regions of the P-type semiconductor region 55b which are located on both sides of the gate electrode 61 as seen in a plan view so as to contain a N-type impurity.

An interlayer dielectric 63 is provided on the isolation insulating film 57, the gate electrode 61 and part of the gate insulating film 59. On the interlayer dielectric 63, a lower electrode (i.e., FG electrode)of the ferroelectric capacitor 44 made of platinum (Pt) having a size of 300 nm×300 nm and a thickness of 50 nm are provided. The gate electrode 61 is connected to the lower electrode 67 through a plug wire 66 penetrating through the interlayer dielectric 63. The gate lengths of the PMIS 47 and the NMIS 49 are 200 nm and the gate widths of the PMIS 47 and the NMIS 49 are 2000 nm.

The ferroelectric capacitor 44 comprises a lower electrode 67, a ferroelectric film 65 provided on the interlayer dielectric 63 and the lower electrode 67 and made of lead lanthanum titanate (PLT) having a thickness of approximately 400 nm, and an upper electrode 69 provided on the ferroelectric film 65 and made of Pt having a size of 300 nm×300 nm and a thickness of 100 nm. The N-type source and drain regions 52b are connected to the N-type semiconductor region 55a through the wire 71b, and the P-type source and drain regions 52a are connected to the P-type semiconductor region 55b through the wire 71a. And, the source region of the P-type source and drain regions 52a is electrically connected to the source region of the N-type source and drain regions 52b through the wire 73 and the plug 54 provided above the source regions.

Subsequently, a fabrication method of the multiplier so configured will be described in brief It should be appreciated that this multiplier can be fabricated using a known technology.

First of all, the semiconductor substrate (hereinafter simply referred to as a substrate) 51 made of Si is prepared, and the embedded insulating film 53 is formed within the substrate 51. Then, the isolation insulating film 57 is formed using a silicon nitride film as a mask by a LOCOS process.

Then, the silicon nitride film is removed using hot phosphoric acid or the like, and impurity ions such as phosphorus are implanted into part of the active region of the semiconductor substrate 51, thereby forming the N-type semiconductor region 55a. In the same manner, impurity ions such as boron are implanted into part of the active region, thereby forming the P-type semiconductor region 55b.

Then, the substrate 51 is thermally oxidized, thereby forming the gate insulating film 59 comprised of a silicon oxide film on the N-type semiconductor region 55a and the P-type semiconductor region 55b. Then, the gate electrode 61 made of polysilicon is formed on the gate insulating film 59 using a known technique.

Then, impurities are implanted by self-alignment using the gate electrode 61 as a mask, thereby forming the P-type source and drain regions 52a and N-type source and drain regions 52b.

Then, the interlayer dielectric 63 made of silicon oxide is formed on a surface of the substrate 51 by a CVD process.

Then, part of the interlayer dielectric 63 is opened by etching or the like. Thereafter, the opening is filled with tungsten by sputtering, thereby forming the plug wire 66 and the plug 54. Then, the wires 71a, 71b, and 73 are formed.

Then, Pt is deposited on the interlayer dielectric 63 by sputtering, and is then patterned, thereby forming the lower electrode 67.

Then, RF magnetron sputtering is performed in oxygen and argon atmosphere at, for example, substrate temperature of 600° C., thereby forming the ferroelectric film 65 made of PLT on the substrate. Thereafter, a Pt film is deposited on the ferroelectric film 65 by sputtering and patterned, thereby forming the upper electrode 69.

Subsequently, an operation of the multiplier 41 configured as described above, will be described.

Referring to FIGS. 4 and 5, in the multiplier 41, a weight signal (weight voltage $V_w$) is input to the upper electrode 69, and the wire 71a is electrically grounded. A signal is input to the wire 71b and an output signal ($V_{out}$) is output from the wire 73. When the application of the voltage to the upper electrode 69 is stopped after application of the voltage, surplus or deficiency of charge occurs in the FG electrode due to polarization of the ferroelectric. The surplus or deficiency of charge causes the potential of the FG electrode to vary, and thereby causes the output voltage to vary. In this source follower circuit, under the condition in which the potential of the FG electrode is constant, a ratio between the input voltage $V_{in}$ and the output voltage $V_{out}$, i.e., $V_{out}/V_{in}$ (referred to as a multiplication coefficient) is substantially constant.

As should be appreciated, the multiplier 41 of this embodiment is excellent in that variation in potential $V_{FG}$ of the floating electrode relative to variation in the output voltage $V_{out}$ is small. In other words, in the source follower circuit, its gate input has a high impedance with respect to its output.

Specifically, during NN operation, the output voltage $V_{out}$ is transmitted to the v MIS, and this output voltage $V_{out}$ sometimes varies under the influence of the output voltage from another multiplier 41. Because the multiplier 41 of this embodiment has a ferroelectric capacitor, unexpected polarization occurs in the ferroelectric if $V_{FG}$ has varied by the variation in the output voltage $V_{out}$.

In the multiplier 41 of this embodiment, since the variation in the FG voltage $V_{FG}$ becomes small with the use of the source follower circuit, generation of unwanted polarization in the ferroelectric capacitor is inhibited. Thus, in the multiplier 41 of this embodiment, reliability of an operation is high.

In the multiplier 41 of this embodiment, since polarization amount of ferroelectric can be controlled by the magnitude or positive or negative polarity of the voltage pulse (weight voltage $V_w$) to be applied to a write terminal, the ratio between the input voltage and the output voltage can be controlled. That is, in accordance with the multiplier of this embodiment, the weight coefficient (weight) in multiplication can be varied.

Hereinafter, this will be described in detail.

Figure 7:
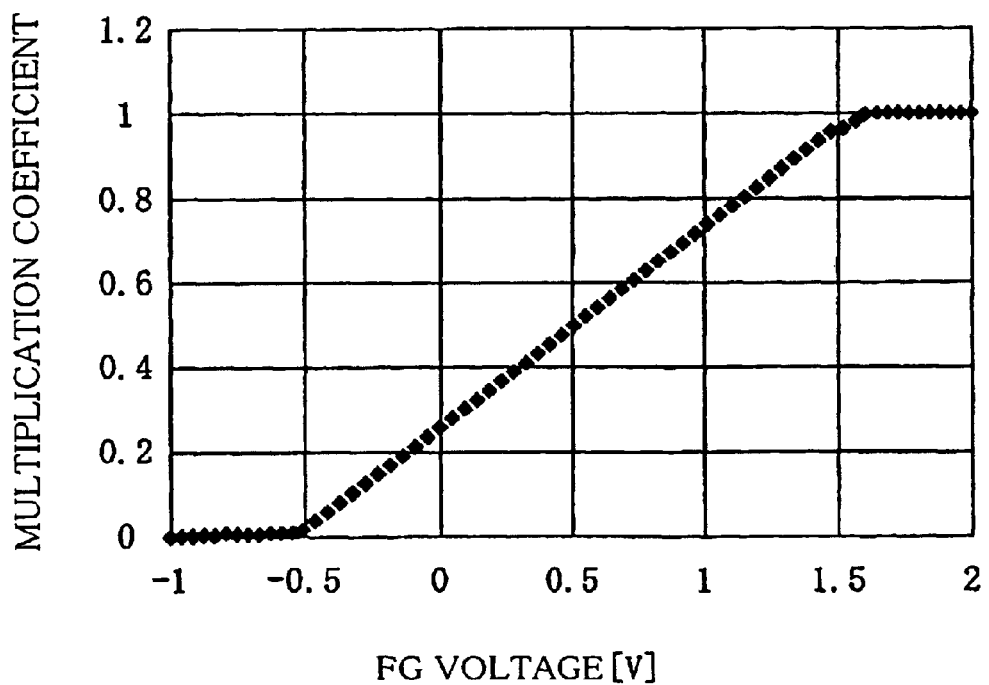
FIG. 7 is a view showing the relationship between a FG voltage and a multiplication coefficient in a source follower circuit for use in the multiplier according to the first embodiment.

FIG. 7 is a view showing the relationship between the FG voltage and the multiplication coefficient in the source follower circuit for use in the multiplier of this embodiment. In FIG. 7, abscissa axis indicates the FG voltage, meaning a hold potential of the FG voltage with the weight voltage $V_w$ removed. Ordinate axis indicates a multiplication coefficient as the ratio between the output and input.

From measurement result shown in FIG. 7, it is shown that in the multiplier of this embodiment, the value of the multiplication coefficient (weight) can be linearly controlled within a range of not less than 0 and not more than 1 by the FG voltage. That is, in this range, when K is a proportional constant and δ is voltage shift, $$V_{out}/V_{in} = K(V_{FG} - \delta)$$

That is, $V_{out} = K(V_{FG} - \delta) \cdot V_{in}$. The voltage shift δ is determined by, for example, setting the threshold of the NMIS or PMIS included in the source follower circuit. Referring to FIG. 7, the voltage that crosses the abscissa axis of the graph corresponds to δ, and is equal to about −0.5[V]. Thus, since $V_{out} = K(V_{FG} - \delta) \cdot V_{in}$, the output $V_{out}$ obtained by multiplying the input voltage $V_{in}$ by a term proportional to the FG voltage $V_{FG}$ (hence a term controllable by $V_w$) is produced. In addition, the multiplication coefficient $V_{out}/V_{in}$ can be linearly controlled by the FG voltage $V_{FG}$. Therefore, the weight can be easily controlled by controlling the weight voltage $V_w$.

In the example of this embodiment, when setting the weight in the NN operation, a range of the weight voltage may be set so that the FG voltage lie within the range of substantially −0.5V to 1.5V after application of the weight voltage $V_w$.

Since the multiplier of the present invention employs a method of controlling the weight coefficient by the ferroelectric, the weight can be adjusted by far faster than that in the conventional multiplier. For example, the multiplier of this embodiment was able to adjust the weight value even when the pulse voltage of 10 nsec is used.

On the other hand, the conventional multiplier using charge tunnel phenomenon of the insulating film requires a write time as long as about several msec, and therefore, it has been found that the multiplier of this embodiment is capable of weight modulation at a speed 5 digit or more faster than the conventional multiplier.

As should be appreciated, in the neural network system of the first embodiment of the present invention, since the multiplier capable of high-speed weight modulation by connecting the ferroelectric capacitor to the gate electrode of the source follower circuit, is used, the operation time and learning time are significantly reduced.

As should be appreciated, in the neural network system of this embodiment, description has been made of an example using the SOI substrate as the substrate, but, a similar multiplier can be achieved using a semiconductor substrate in the state in which well is separated.

While in the multiplier described in this embodiment, PLT is used as a ferroelectric material forming the ferroelectric capacitor, a similar multiplier can be fabricated using ferroelectric having a perovskite structure such as bismuth titanate (BIT) or strontium bismuth tantalate (SBT).

While in the multiplier of this embodiment, the range of voltage to be applied for controlling the weight is approximately not less than −0.5V and not more than 1.5V as shown in FIG. 7, this range can be adjusted by changing design of components within the source follower circuit, for example, by changing an area of the gate electrode, the thickness of the gate insulating film, or concentration of the impurities contained in the source and drain regions of the MIS transistor.

In the source follower circuit included in the multiplier of this embodiment, the drain of the NMIS 49 and the substrate region of the PMIS 47 are connected to each other, and the drain of PMIS 47 and the substrate region of the NMIS 49 are connected to each other, for the purpose of improving stability of the operation. Nonetheless, when isolation is provided on the substrate as in this embodiment, this structure is not necessarily adopted.

While the source follower circuit of this embodiment has a region where the multiplication coefficient increases linearly relative to the FG voltage, even a circuit having a region where the multiplication coefficient linearly decreases can be preferably used in the multiplier of this embodiment. In addition, by combining the multiplier having such a circuit with the multiplier having the source follower circuit of this embodiment, learning based on the BP method can be carried out. Although control becomes somewhat complex, a circuit in which the multiplication coefficient monotonically increases or monotonically decreases relative to the FG voltage, can be used in the multiplier. It should be noted that the PMIS 47 may be replaced by a resistive element, but in this case, learning time becomes longer.

Instead of the ferroelectric film, the multiplier of this embodiment may use a resistance variable material mentioned later. Since the resistance variable material has a resistance value varying depending on the condition, the resistance value can be varied according to the weight voltage $V_w$ and the value of the output voltage $V_{out}$ relative to the weight voltage $V_w$ can be varied.

In the multiplier of this embodiment, the PMIS 47 and the NMIS 49 may be PMOS and NMOS, respectively. Furthermore, an inverter with the PMIS 47 and the NMIS 49 reversed in positional relationship, functions as a multiplier that inverts an output in digital.

[Modification of First Embodiment]

A modification of the multiplier for use in the neural network system according to the first embodiment of the present invention will be described below.

Figure 8:
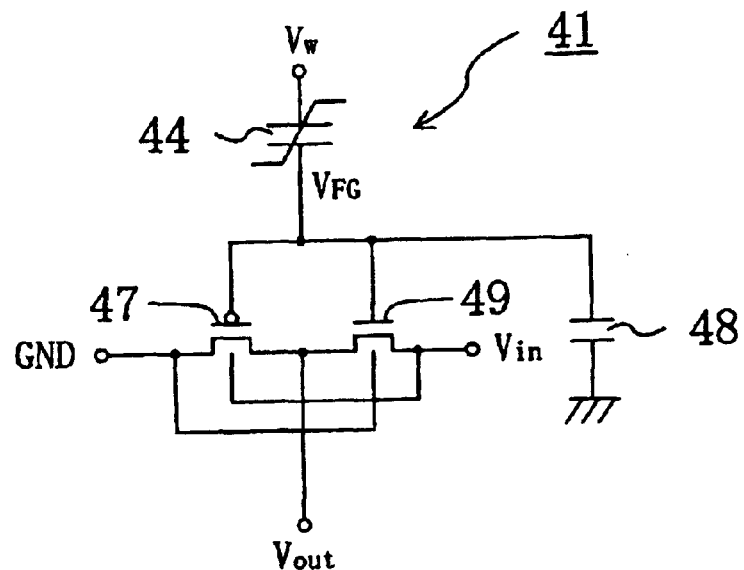
FIG. 8 is a circuit diagram showing a modification of the multiplier according to the first embodiment of the present invention.

FIG. 8 is a circuit diagram showing the modification of the multiplier for use in the neural network system of this embodiment.

As shown in FIG. 8, the multiplier of this modification is obtained by further providing a voltage-division adjusting capacitor 48 between the lower electrode of the ferroelectric capacitor 44 and a grounding conductor on the multiplier of described in the first embodiment.

In the multiplier of this modification, the voltage-division adjusting capacitor 48 is connected to the ferroelectric capacitor 44 in parallel with the PMIS 47 and the NMIS 49. Therefore, by adjusting a capacitance of the voltage-division adjusting capacitor 48, adjustment can be made so that a voltage given to the ferroelectric capacitor 44, a voltage given to the MIS capacitor present in the PMIS 47 and a voltage given to the MIS capacitor present in the NMIS 49 are optimized.

The reason why this voltage-division adjustment is necessary, will be described. When capacitance of the ferroelectric capacitor in a certain condition is C1, capacitance of the PMIS 47, capacitance of the NMIS 49, and capacitance of the voltage-division adjusting capacitor 48 are respectively C2, C3, and C4, the voltage given to the ferroelectric capacitor 44 is V1, and the voltage given to the PMIS 47, the voltage given to the NMIS 49, and the voltage given to the voltage-division adjusting capacitor 48 are V2, V1/V2=(C2+C3+C4)/C1. From this formula, it should be understood, by increasing the area of the voltage-division adjusting capacitor 48 to increase the capacitance C4, the voltage given to the ferroelectric capacitor 44 can be increased. On the other hand, in the multiplier described in the first embodiment, the ferroelectric capacitor cannot be made to be as minute as the MIS transistor using a current fabrication technology. For this reason, when the area of the multiplier is minimized, the voltage given to the ferroelectric capacitor 44 becomes too small, which makes it difficult to vary the weight as it has been set. On the other hand, in accordance with the multiplier of this modification, since the voltages given to the respective capacitors are optimized by increasing the voltage given to the ferroelectric capacitor 44, the weight can be varied as it has been set.

(Second Embodiment)

A neural network system according to a second embodiment of the present invention is different only in structure of multiplier from the neural network system according to the first embodiment, and therefore, only the multiplier will be described.

Figure 9:
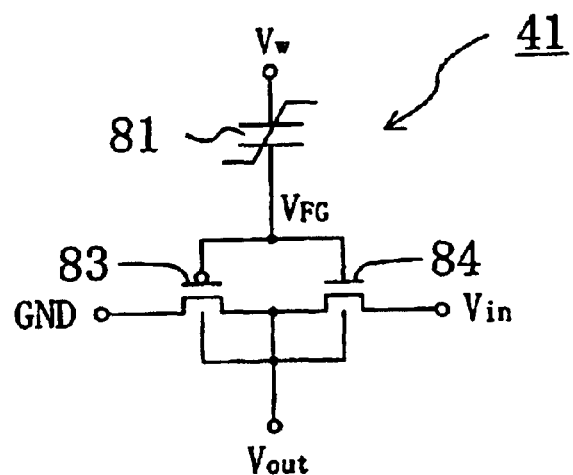
FIG. 9 is a circuit diagram showing a configuration of a multiplier for use in a neural network system according to a second embodiment of the present invention.

FIG. 9 is a circuit diagram showing a configuration of the multiplier for use in the neural network system of this embodiment. As can be seen from FIG. 9, the multiplier of this embodiment is different in connection method of NMIS and PMIS from the multiplier according to the first embodiment.

As shown in FIG. 9, in the multiplier of this embodiment, a ferroelectric capacitor 81 is connected to a common gate electrode of a source follower circuit configured by NMIS 84 and PMIS 83. A source of the PMIS 83 and a source of the NMIS 84 are connected to each other and a substrate region of the PMIS 83 and a substrate region of the NMIS 84 are connected to each other. Further, the source of the PMIS 83 and the substrate region of the PMIS 83 are connected to each other, and the source of the NMIS 84 and the substrate region of the NMIS 84 are connected to each other. And, a drain of the PMIS 83 is connected to a grounding conductor.

Figure 10:
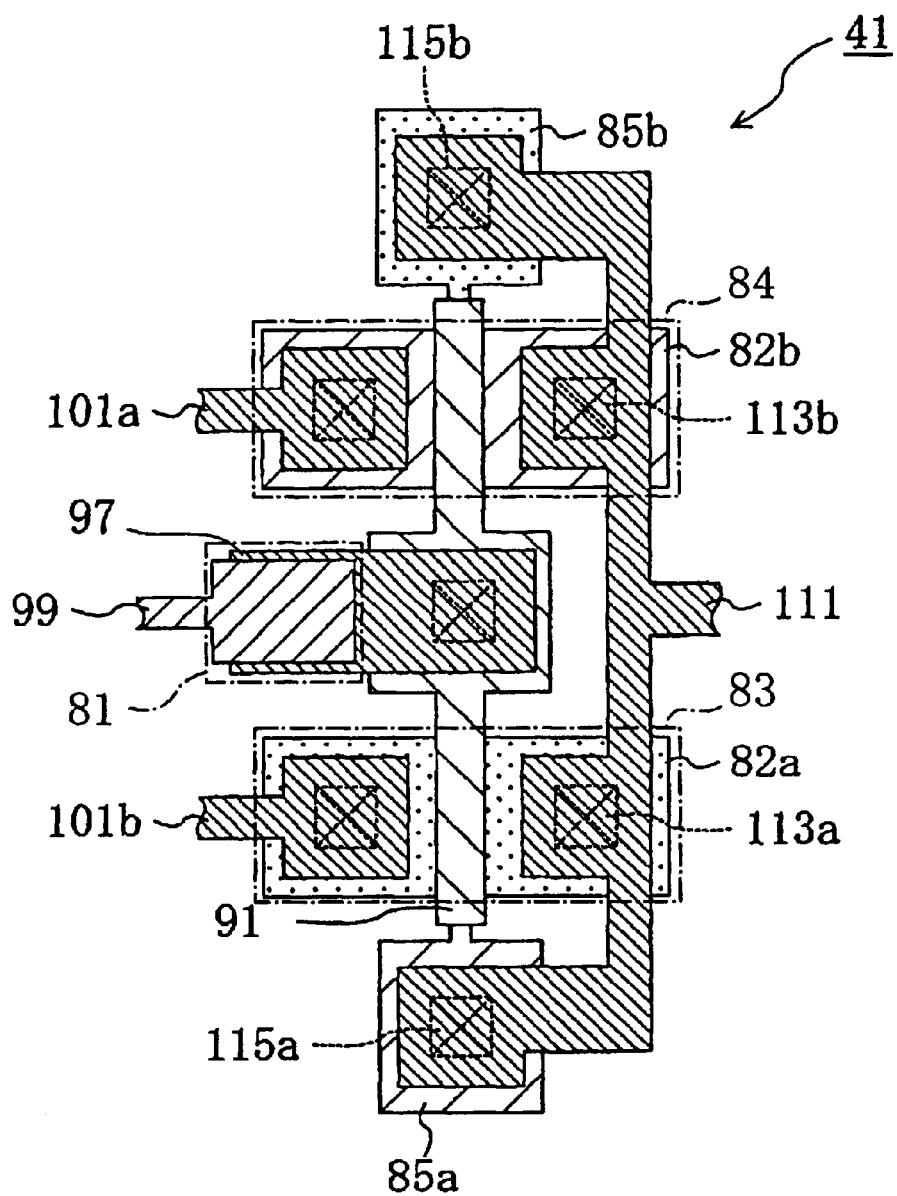
FIG. 10 is a plan view showing the multiplier in FIG. 9 as seen from above.

FIG. 10 is a plan view of the multiplier of this embodiment as seen from above. In FIG. 10, for easier understanding, part of hidden lines are omitted, and the same components as those of the multiplier of the first embodiment will not be described in detail.

As shown in FIG. 10, the multiplier of this embodiment comprises a SOI substrate (not shown), and PMIS 83, NMIS 84, and ferroelectric capacitor 81 which are provided on the SOI substrate. The PMIS 83 has the substrate region, P-type source and drain regions 82a, a gate insulating film, and a gate electrode 91. The NMIS 84 has the substrate region, N-type source and drain regions 82b, a gate insulating film, and the gate electrode 91 common to the PMIS 83.

A source region of the P-type source and drain regions 82a is connected to a source region of the N-type source and drain regions 82b through a wire 111 and plugs 113a and 113b. And, a source side of the P-type source and drain regions 82a is connected to the substrate region of the PMIS 83 through the plug 113a, the wire 111, a plug 115a and a N-type semiconductor region 85a, and a source side of the N-type source and drain regions 82b is connected to the substrate region of the NMIS 84 through the plug 113b, the wire 111, a plug 115b and a P-type semiconductor region 85a.

The ferroelectric capacitor 81 is comprised of a lower electrode 97 connected to the gate electrode 91, a ferroelectric film (not shown in FIG. 10), and an upper electrode 99.

From comparison between FIG. 10 and FIG. 5, it should be understood that the multiplier of this embodiment can make an occupied area of the cell smaller than that of the multiplier of the first embodiment. This is because, in the multiplier of this embodiment, the length of the wire for stabilizing a substrate potential of the MIS transistor is shorter than that of the multiplier of the first embodiment.

Thus, the multiplier of this embodiment exhibits high performance as in the multiplier of the first embodiment without the use of complex wiring or multi-layered wires. That is, the multiplier of this embodiment has high performance as in the multiplier of the first embodiment and has a smaller cell area.

As a result of comparison of areas of the multipliers tested by the inventors of the present invention, when a minimum process size is F, the cell area of the multiplier according to the first embodiment is $289F^2$ and the cell area of the multiplier according to this embodiment is $189F^2$. From this result, in accordance with the multiplier of this embodiment, the cell area can be reduced 35% as compared to the multiplier according to the first embodiment.

In the neural network system, since the occupied area of the multiplier is extremely large, a chip area of the neural network system can be reduced almost 20% and a cost of the chip can be further reduced by using the multiplier of the second embodiment.

It should be noted that, since the wire of the output in which the voltage varies is connected to the semiconductor region, it is particularly desirable that influence of potentials of multipliers located in the vicinity is minimized by using the SOI substrate.

An operation principle of the multiplier of this embodiment is basically similar to that of the multiplier of the first embodiment, and the voltage of the FG electrode is varied by charge due to polarization of the ferroelectric.

Figure 11:
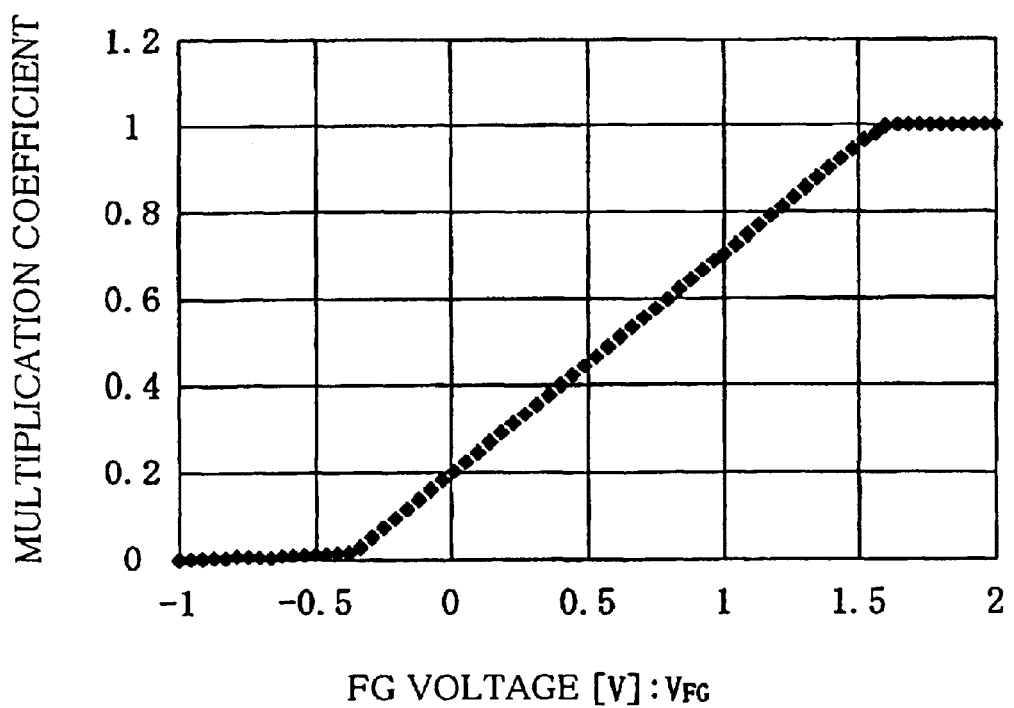
FIG. 11 is a view showing the relationship between a FG voltage and a multiplication coefficient in a source follower circuit for use in the multiplier in FIG. 9.

FIG. 11 is a view showing the relationship between the FG voltage and the multiplication coefficient in the source follower circuit for use in the multiplier of this embodiment.

As shown in FIG. 11, it should be understood that, in the configuration of the source follower circuit of this embodiment, the multiplication coefficient can be controlled linearly within a range of not less than 0 and not more than 1 by the potential of the FG electrode, as in the source follower circuit for use in the multiplier of the first embodiment.

From comparison between FIG. 11 and FIG. 7, it should be especially noted that linearity of the multiplication coefficient is improved in the vicinity of 1. In the multiplier of the first embodiment, since a substrate potential of the PMIS is raised up to an input voltage, a threshold voltage is effectively increased, which causes both of the PMIS and the NMIS to tend to have a higher resistance, whereas in the multiplier of this embodiment, since the substrate electrode (substrate region) is connected to the output, either the PMIS or the NMIS tends to have a lower resistance, so that very satisfactory linearity is obtained relative to the FG voltage under the condition in which the multiplier coefficient is within the range of 0 to 1, and in addition, a high-speed operation is achieved.

As should be appreciated from the foregoing, the neural network system of this embodiment comprises the multiplier having a cell area smaller than that of the multiplier of the first embodiment and having multiplication function with very satisfactory linearity. Therefore, a manufacturing cost of the semiconductor chip in which the neural network system is mounted can be reduced, and a higher-performance neuro computer can be achieved by improving degree of integration of the system.

In the multiplier of this embodiment, by further providing the voltage-division adjusting capacitor connected in parallel with the PMIS 83 and the NMIS 84, the voltage given to the ferroelectric capacitor 81, the voltage given to the MIS capacitor present in the PMIS 83, and the voltage given to the MIS capacitor present in the NMIS 84 can be optimized.

(Third Embodiment)

A neural network system according to a third embodiment of the present invention comprises a multiplier using a phase-change memory technology.

Figure 12:
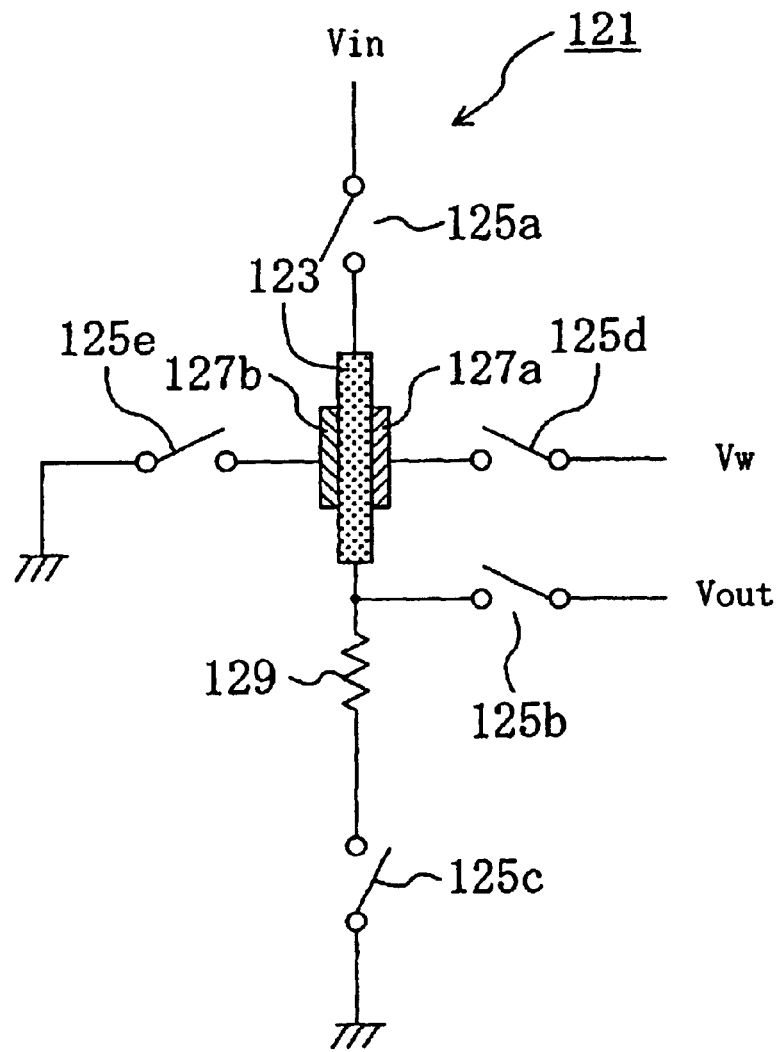
FIG. 12 is a view showing a configuration of a multiplier for use in a neural network system according to a third embodiment of the present invention.

FIG. 12 is a view showing a configuration of the multiplier included in the neural network system of this embodiment.

As shown in FIG. 12, a multiplier 121 of this embodiment comprises a first electrode 127a, a second electrode 127b, a resistance variable material 123 disposed between the first electrode 127a and the second electrode 127b, and a resistive element 129 connected to the resistive variable material 123. A switch 125d for ON/OFF controlling application of a weight voltage $V_w$ is connected to the first electrode 127a. A switch 125a for ON/Off controlling application of an input voltage $V_{in}$ is connected to one end of the resistive variable material 123. A switch 125b for controlling an output of an output voltage $V_{out}$ is connected to a wire through which the resistive element 129 is connected to the resistance variable material 123. Further, a switch 125c for ON/OFF controlling connection to a grounding conductor is connected to the resistive element 129. A switch 125d for ON/OFF controlling connection to the grounding conductor is connected to the second electrode 127b. Here, the switches may be comprised of combination of logic circuits, or may be mechanism switches.

In this embodiment, the resistance variable material is, for example, alloy containing three elements, i.e., germanium (Ge), tellurium (Te), and antimony (Sb) as major components.

In the multiplier of this embodiment, a voltage given to the resistance variable material 123 and a voltage given to the resistive element 129 are varied by varying a electric resistance of the resistance variable material 123, and thereby the output voltage Vout with respect to the input voltage Vin is varied, thus performing multiplication. Hereinafter, an operation of the multiplier of this embodiment will be described.

First of all, in the multiplier of this embodiment, in order to vary a resistance value of the resistance variable material 123, the switches 125a, 125b, and 125c are turned OFF and the switches 125d and 125e are turned ON, in which state the weight voltage $V_w$ is applied. Thereby, a current flows between the first electrode 227a and the second electrode 227b, and causes the resistance variable material 123 to generate heat. At this time, by controlling temperature of the resistance variable material 123 by, for example, magnitude of the $V_w$, the resistance variable material 123 can be controlled to be polycrystalline or amorphous state. The resistance variable material 123 for use in the multiplier of this embodiment is capable of increasing a resistance value in the amorphous state to be 100 times higher at maximum than a resistance value in the polycrystalline state. Control of crystallinity of the resistance variable material is executed as described below, for example.

First, in order to cause the resistance variable material 123 to be amorphous, a sufficient weight voltage $V_w$ is applied to increase temperature of the resistance variable material 123 to be not lower than a melting point of the resistance variable material 123, thereby causing the resistance variable material 123 to be melted. Then, the weight voltage $V_w$ is turned OFF to reduce the temperature of the resistance variable material 123 quickly, thereby causing the resistance material 123 to be made amorphous.

On other hand, in order to crystallize the resistance variable material 123, the weight voltage $V_w$ is applied to allow the temperature of the resistance variable material 123 to be not higher than the melting point. By this operation, crystallization of the resistance variable material 123 gradually proceeds and the resistance value gradually decreases. At this time, $V_w$ is applied in the form of a pulse with a constant width.

Thus, in the multiplier of this embodiment, crystallinity of the resistance variable material 123 can be controlled by controlling the value or waveform shape of the weight voltage $V_w$.

Since it is difficult to gradually increase the resistance value of the resistance variable material 123, in the case where the resistance value of the resistance variable material 123 needs to be reduced, a desired resistance value is obtained by adjusting time during which the weight voltage $V_w$ is applied after the resistance variable material 123 is once heated to be amorphous.

On the other hand, when the multiplier of this embodiment performs operation, the switches 125a, 125b, and 125c are turned ON and the switches 125d and 125e are turned OFF. Thereby, an output voltage $V_{out}$ according to the voltage given to the resistance variable material 123 and the voltage given to the resistive element 129, is output. At this time, since the resistance value of the resistance variable material 123 can take a plurality of values (about 100 gradations), a desired weight can be set.

As should be appreciated from the foregoing, the multiplier of this embodiment is capable of setting a desired weight as in the first and second multipliers. In addition, since write time of the resistance variable material 123 as short as 100 sec or less is sufficient, the learning operation of the neural network system of this embodiment is faster than that of the conventional neural network system.

The multiplier of this embodiment is easily small-sized and is advantageous in integration of the neural network system, because of its relatively simple device structure.

Since the multiplier of this embodiment can realize a plurality of weights according to analog signals as in the multipliers of the first and second embodiments, the multiplier of this embodiment can be caused to learn by the BP method as in the multiplier of the first and second embodiments.

While the multiplier of this embodiment is configured such that the resistive element 129 is provided between the resistance variable material 123 and the switch 125c, the resistive element 129 may be provided between the resistance variable material 123 and the switch 125a. Also in this case, a potential at an intermediate point between the resistive element 129 and the resistance variable material 123 varies according to crystallinity of the resistance variable material, an output voltage can be output from the intermediate point.

The multiplier of this embodiment in FIG. 12 may use the structure described in the first or second embodiment. In this case, an output portion of the multiplier of this embodiment (portion of the switch 125b) may be connected to the gate electrode of the PMIS 47 and the gate electrode of the NMIS 49 shown in FIG. 4. Thereby, even when a resistance of the device connected to the output portion varies and a potential of the output portion varies, the voltage applied to the resistance variable material is less likely to vary, thereby allowing the weight value to be less likely to vary. Although the multiplier using the resistance variable material is less susceptible to an effect of voltage variation of the output portion in contrast with the multiplier using ferroelectric, resistance connected to the output portion of the multiplier might be significantly changed in the neural network system, and therefore this structure can achieve a more stable operation. In the same manner, the configuration of the second embodiment in FIG. 9 may be connected to the multiplier of this embodiment.

While in this embodiment, alloy containing Ge, Te, and Sb is used for the resistance variable material 123, chalcogenide material is preferably used as well, and other materials may be used, provided that they can hold different resistance values.

(Fourth Embodiment)

In a fourth embodiment of the present invention, a learning method of a neural network system will be described with reference to the drawings. The learning method of this embodiment can be used in the neural network systems having multipliers (synapses) described in the first to third embodiments. Hereinafter, only a procedure of the learning method of the neural network system of this embodiment, will be described.

The learning method of the neural network system of this embodiment is executed by the BP method and configured to correct a weight value based on output variation generated when slightly varying an output and a weight. Further, the learning method offers weight setting procedure effective in the case where a neuro device exhibits non-linearity or hysteresis characteristic, for example, when polarization information of ferroelectric is a weight.

Initially, parameters used in the BP method will be described.

Referring to FIG. 2, it is assumed that an input value is given to the neuro device 3 and an output value and a target value (teaching value) at this time are Ok and Tk, respectively. Here, k indicates a number of output vector. When the number of output terminals is n, k is a natural number in the range of not less than 1 and not more than n.

In this case, an error Ep is defined by the following formula:

$$Ep = \Sigma(k=1 \text{ to } n)(Tk-Ok)^2 \qquad (3)$$

Subscript p represents an input/output pattern number.

When an amount of variation in the weight in the intermediate layer is $\Delta Vkj$ and an amount of variation in the weight in the output layer is $\Delta Wji$, in the BP method, $\Delta Vkj$ and $\Delta Wji$ are calculated according to the following formulae:

$$\Delta Vkj = -\alpha \cdot \delta Ep/\delta Vkj \qquad (4)$$

$$\Delta Wji = -\alpha \cdot \delta Ep/\delta Wji \qquad (5)$$

where j is a number of the neuro unit 33 in the intermediate layer and i is a number of an input.

Here, $\alpha$ is a learning coefficient which determines an amount of variation in the weight. When $\alpha$ is too large, the error exceeds a point at which the error becomes minimum, whereas when $\alpha$ is too small, learning takes time, and therefore, the $\alpha$ is set to a numeric value with which learning is efficiently carried out for every operation. In this embodiment, for example, $\alpha=0.8$.

Using the formulae (4) and (5), new weights Vkj (new) and Wji (new) are given by the following formulae:

$$Vkj(\text{new}) = Wji(\text{old}) + \Delta Vkj \quad (6)$$

$$Wji(\text{new}) = Wji(\text{old}) + \Delta Wjj \quad (7)$$

From the formulae (3) to (7), variation in the error occurring when varying the weight slightly is obtained and calculated, thereby carrying out learning operation by the BP method.

Subsequently, the learning operation of the neural network system of this embodiment will be described. Here, procedure in the neural network system 1 of the first and second embodiments comprising multipliers having ferroelectric capacitors, will be described.

Referring to FIGS. 1 to 4, the learning operation is carried out in the following steps (a) to (s).

(a) All the weights are initialized. In initialization, random numbers are desirably used.

(b) The control portion 15 selects one of output/output patterns in the memory 5.

(c) The input data holding portion 7 reads out the input data corresponding to the selected input/output pattern from the memory 5 and inputs the input data to the neuro device 3.

(d) After a transient response time lapses and when the output is stabilized, the control portion 15 stores a vector Ook of the output value in the memory 19.

(e) The control portion 15 calculates an error Epo from the teaching value Tk of the selected pattern which has been read out from the memory 5 and the output value Ook, and stores the calculated value in the memory 19.

(f) Upon reception of the signal from the control portion 15, the cell selecting portion 17 selects the synapse 41 in which weight is to be varied. The synapse is selected from all the synapses 41 in the intermediate layer and the output layer.

(g) The control portion 15 calculates a slight-variation weight Wtmp obtained by slightly varying a current weight value Wnow of the selected synapse 41 by $\Delta W$. The variation depends on resolution of the weight, but is preferably set to a minimum value. In this embodiment, $\Delta W = 50[\text{mV}]$.

(h) The control portion 15 applies a positive or negative voltage at which the ferroelectric is saturated sufficiently to the weight electrode of the synapse (upper electrode 69 of the ferroelectric capacitor 44) and resets a polarization state. In this embodiment, reset is carried out at a negative voltage. For example, by applying $-15[\text{V}]$, polarization is oriented in the same direction.

(i) The control portion 15 applies the weight voltage $V_w$ corresponding to the slight-variation weight Wtmp to the synapse 41. Thereby, the weight in the corresponding synapse 41 is re-written (set) to the slight-variation weight Wtmp.

(j) After a transient response time lapses and when the output is stabilized, the control portion 15 obtains a vector O1k of the output value.

(k) The control portion 15 calculates an error Ep1 from the teaching value Tk and the output value O1k.

(l) The control portion 15 calculates difference $\Delta Ep$ between the error Ep1 and the error Ep0 stored previously in the memory 19.

(m) The control portion 15 calculates an error variation according to the formula (4) or (5) and by the following formula.

$$\Delta Vkj = -\alpha \cdot \Delta Ep/\Delta W \quad (8)$$

$$\Delta Wji = -\alpha \cdot \Delta Ep/\Delta W \quad (9)$$

(n) The control portion 15 substitutes a calculation result from the formula (8) or (9) into the formula (6) or (7), thereby calculating a new weight.

(o) The control portion 15 applies a reset voltage to the weight electrode of the synapse 41.

(p) The control portion 15 applies the weight voltage $V_w$ corresponding to the newly calculated weight to the weight electrode of the synapse 41. Thereby, the weight in the synapse 41 is rewritten to the newly calculated weight.

(q) The control portion 15 repeats steps (b) to (p) for different synapses.

(r) The control portion 15 repeats steps (b) to (q) for different input/output patterns in the same manner.

(s) When all the errors Ep corresponding to all the input/output patterns are smaller than a desired value, the learning operation is completed.

Through the above steps, the learning operation of the neural network system of the fifth embodiment is carried out.

The learning operation of this embodiment is characterized in that the weight is varied after applying the reset voltage shown in the step (h) and the step (o).

The reason why such reset operation becomes necessary, will be described below.

In the neural network system of this embodiment, ferroelectric is used in the weight control of the synapses, and a polarization value of the ferroelectric exhibits hysteresis according to an application history of the voltage.

Figure 13:
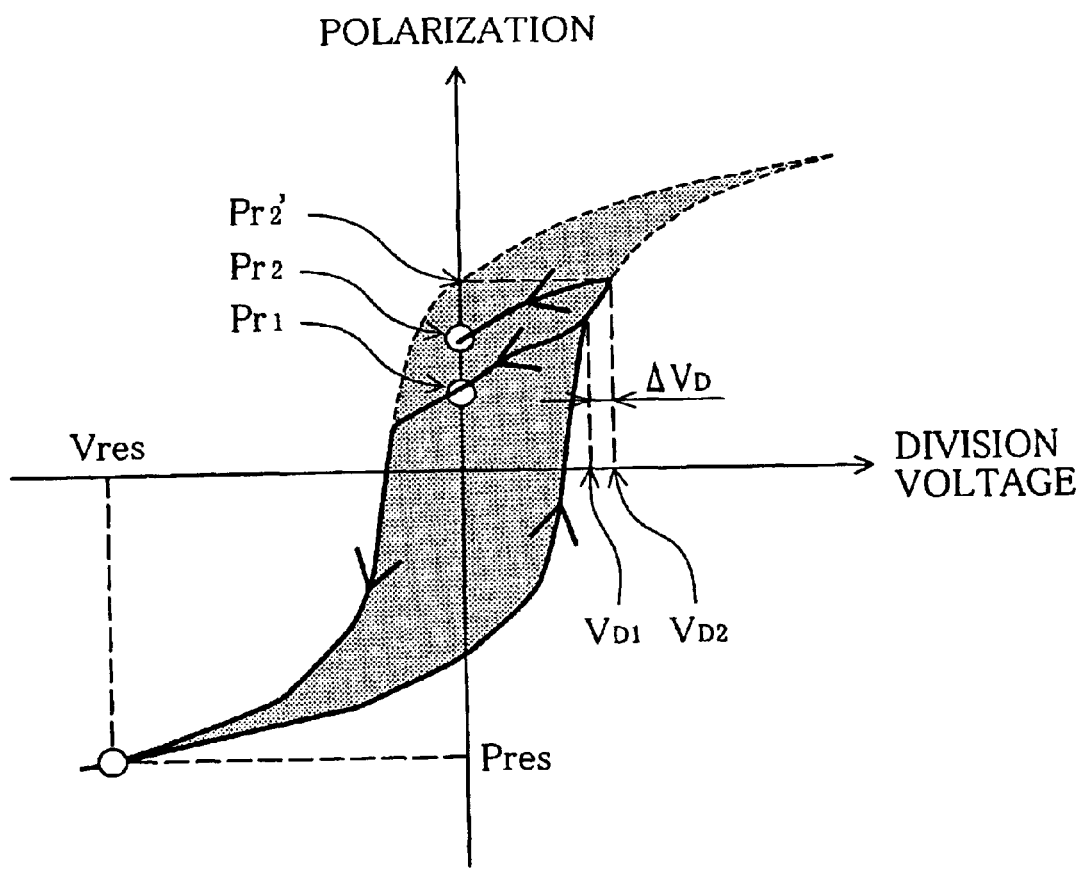
FIG. 13 is a view showing the relationship between an applied voltage and polarization (P-V characteristic) in ferroelectric.

FIG. 13 is a view showing the relationship between the applied voltage and polarization (P—V characteristic) in the ferroelectric. In FIG. 13, the abscissa axis indicates a voltage given to the ferroelectric capacitor.

In this embodiment, since lead lanthanum titanate having a thickness of 400 nm is used as a ferroelectric layer of ferroelectric capacitor, a saturation voltage is about 15[V], and a residual polarization value is approximately 10 $[\mu C/cm^2]$.

The P—V characteristic of the ferroelectric is such that polarization exhibits a hysteresis characteristic counter-clockwise with respect to the applied voltage and moves according to an application history of the voltage within a saturation loop Ls (minor loop). That is, polarization moves within a portion represented by hatching in FIG. 13 according to the application history of the voltage. For this reason, if the weight voltage $V_w$ corresponding to the weight calculated by means of the formula according to the BP method is simply applied, then a weight greatly different from a target weight value would be set. As a result, a fatal error would occur in re-inputting the weight vector at the time point of completion of learning to the neural network system.

Specifically, even if a final weight matrix owned by the control portion is re-input in the case where polarization is caused to converge by moving it on the minor loop, the same polarization value is not obtained because hysteresis of ferroelectric is affected by a previous history of the ferroelectric. As a result, although the same weight which has been previously input is intended to be input, an erroneous result is output from the neural network system.

As a solution to the problem, the inventor of the present invention has found that the output can be reproduced stably by resetting the ferroelectric to a saturation point of either a negative voltage or a positive voltage.

As shown in FIG. 13, the voltage applied to the ferroelectric is increased up to a predetermined voltage (hereinafter referred to as a reset voltage) Vres (when Vres is positive) or is decreased (when Vres is negative), and thereafter, based on the reset voltage Vres, the weight value for multiplication is re-calculated and the weight voltage corresponding to the re-calculated weight value is applied. The reset voltage is set to a voltage having an absolute value that is not less than the saturation voltage at which polarization of the ferroelectric is saturated relative to an increase in an absolute value of the applied voltage. By doing such setting, with respect to the voltage having the absolute value not less than the saturation voltage, polarization of the ferroelectric has a one-to-one correspondence. Therefore, by applying the reset voltage Vres, polarization of the ferroelectric is set to a constant value. And, by varying the applied voltage in the direction to reverse the polarity from the reset voltage, the polarization of the ferroelectric varies so as to always move on the saturated loop Ls regardless of its previous history. Therefore, reproducibility of the output relative to the input in the neural network system 1 can be ensured.

Referring to FIGS. 1, 4, and 13, specifically, in this embodiment, the reset voltage Vres is set to a negative saturation voltage. That is, an initial weight value is set so that the voltage given to the ferroelectric capacitor 44 becomes a negative saturation voltage. From there, the weight value is increased. Here, an example of the applied voltage and polarization of the ferroelectric of the ferroelectric capacitor 44 (hereinafter simply referred to as ferroelectric) in the case where the weight is varied slightly under the condition in which the division voltage (weight voltage $V_w$–FG voltage $V_{FG}$) $V_{D1}$ is applied to the ferroelectric capacitor 44. The control portion 15 actually applies the weight voltage $V_w$ to the upper electrode 69 of the ferroelectric capacitor 44 so that the division voltage of the ferroelectric capacitor 44 becomes a desired voltage, but, for the sake of convenience, here it is assumed that the control portion 15 applies the division voltage VD. In this case, the control portion 15 applies the weight voltage $V_w$ which is predetermined times as large as the division voltage VD, thereby causing the weight corresponding to the weight voltage $V_w$ to be set in the synapse 41.

After application of the division voltage $V_{D1}$ to the ferroelectric, the control portion 15 stops application of the voltage. Thereby, the residual polarization of the ferroelectric becomes $P_{r1}$ and the weight value corresponding to this $P_{r1}$ is set in the synapse 41.

Then, the control portion 15 calculates a new division voltage $V_{D2}$ obtained by addition of the a slight division voltage $\Delta V_D$ corresponding to the slight weight $\Delta W$ to the division voltage $V_{D1}$ and applies the reset voltage Vres to the ferroelectric. Thereby, polarization of the ferroelectric varies into predetermined polarization Pres. Thereafter, the control portion 15 applies the new division voltage $V_{D2}$ to the ferroelectric and then stops application of the voltage. Thereby, the polarization of the ferroelectric moves from $P_{res}$ through the saturation loop Ls and reaches polarization Pr2' corresponding to the division voltage $V_{D2}$. Then, the polarization becomes the residual polarization Pr2 corresponding to the division voltage $V_{D2}$. Thereby, a new weight value is set in the synapse 41. In the learning method of this embodiment, this operation is repeated until the weight voltage $V_w$ has reached a value at which the error becomes minimum. The above learning is performed for all the synapses 41. It should be appreciated that a waveform of the reset voltage may be in the form of pulse or step.

Thus, in the learning method of this embodiment, by applying the reset voltage $V_{res}$ just before application of the newly varied weight voltage $V_w$, control and convergence of the weight can be well carried out by the BP method regardless of using the synapses 41 having a device that exhibits non-linear characteristic, such as hysteresis or minor loop, as in the ferroelectric.

In the learning method of this embodiment, the weight value is not affected by the application history of the voltage. Therefore, by storing the weight vector at the time point of convergence of learning in another memory and by recalling the weight vector, the operation of the neural network system 1 can be reproduced. By this method, a learning result obtained in one synapses 41 can be used in another synapse, which significantly reduces the learning time of the neural network system. For example, data at the convergence of learning for numerous operations are pre-stored in the neural network system 41 of the present invention prior to being delivered to the user. This improves convenience to the user as compared to the case where the neural network system 41 in an initial condition is delivered.

By the learning method of this embodiment, learning and a learning completion state can be restored stably while making good use of high-speed operation characteristic and holding capability of the weight data owned by the ferroelectric.

As should be appreciated, the learning method of this embodiment greatly contributes to a practical use of the neural network system having an extremely high function which the conventional network system does not have.

So far, a description has been made of the case where the multiplier as the synapse has a ferroelectric capacitor. The above described learning method is applicable to a neural network system of a third embodiment comprising a multiplier having a resistance variable material, as a modification of this embodiment.

Specifically, a reset pulse with a sufficiently high voltage value (in this modification, a voltage waveform is preferably in the form of pulse) is applied to the synapse to cause the resistance variable material to be melted and changed into amorphous in the learning operation. Then, the weight voltage within the range in which crystallization proceeds is applied to the synapse. The output of the neuro device at this time is compared to the teaching value and an error between them is calculated.

Then, the reset pulse is re-applied to the synapse and then, a voltage obtained by slightly varying a previous weight voltage is applied to the synapse.

Thereby, data (weight vector)of the weight voltage at which an optimal output value is obtained, is obtained similarly to the case where the ferroelectric capacitor is used in the multiplier. Since the resistance variable material (phase-change material) utilizes heat generated by a current, the voltage being applied may be unipolar.

In this modification, a description has been made of control for changing the resistance variable material into amorphous state by the reset pulse and gradually crystallizing the resistance variable material. Conversely, by applying a very short high-voltage pulse, the resistance variable material in polycrystalline state may be gradually changed into amorphous state. Nonetheless, control becomes difficult in this case.

While in this embodiment, the reset voltage in the case where the ferroelectric is used is negative, similar operation becomes possible by applying the reset pulse so that polarization of the ferroelectric is saturated on a positive-voltage side. In that case, the weight voltage $V_w$ is set to a negative voltage, and the weight voltage lower than the negative voltage is applied, starting from the negative voltage.

The learning method of this embodiment may be used in a neural network system comprising synapses exhibiting a characteristic such as monotonous increase or monotonous decrease, in which the multiplication coefficient is determined uniquely with respect to the FG voltage, as well as the neural network systems of the first and second embodiments. Even when synapses having different properties coexist, the learning is performed for each synapse, and therefore, no problem arises.

Depending on the design of the neural network system, it sometimes happens that reset pulse sufficient to saturate polarization of the ferroelectric in the synapse cannot be applied.

In this case, by using a low voltage or a high voltage in a possible range as the reset pulse, a weight value vector which is the most accurate is obtained. In this case, by applying the reset pulse plural times, more accurate reset operation is obtained.

While in this embodiment, in the step (p) described in the above learning operation, the weight voltage corresponding to the weight newly calculated every time the error variation is obtained and calculated is applied, all weights of synapses to be corrected are calculated and stored and correction can be performed for all the synapses all at once. That is, after a value calculated as a new weight may be stored in a storage cell, the weight may be restored on the device, and new weights of all the synapses may be calculated with respect to one input pattern, the weights may be corrected all at once.

Specifically, after calculating all new weight values by repeating the steps (b) to (n), the weights of all the synapses are corrected according to the steps (o) and (p). And, the learning can converge by the method of repeating the above operation while changing the input/output pattern as shown in the step (r).

(Fifth Embodiment)

The learning method of the neural network system described in the fourth embodiment is very effective in the case where the neural network system comprises a device having non-linearity or hysteresis characteristic. However, in a current technology, since allowable number of times polarization of the ferroelectric is inverted is limited, it is considered that the life of the ferroelectric can be extended by reducing the number of times polarization is inverted by the reset voltage.

Accordingly, the inventors have studied a learning method of the neural network system capable of reducing the number of times of the reset pulse in view of possibility of long-term use of the neural network system.

Figure 14:
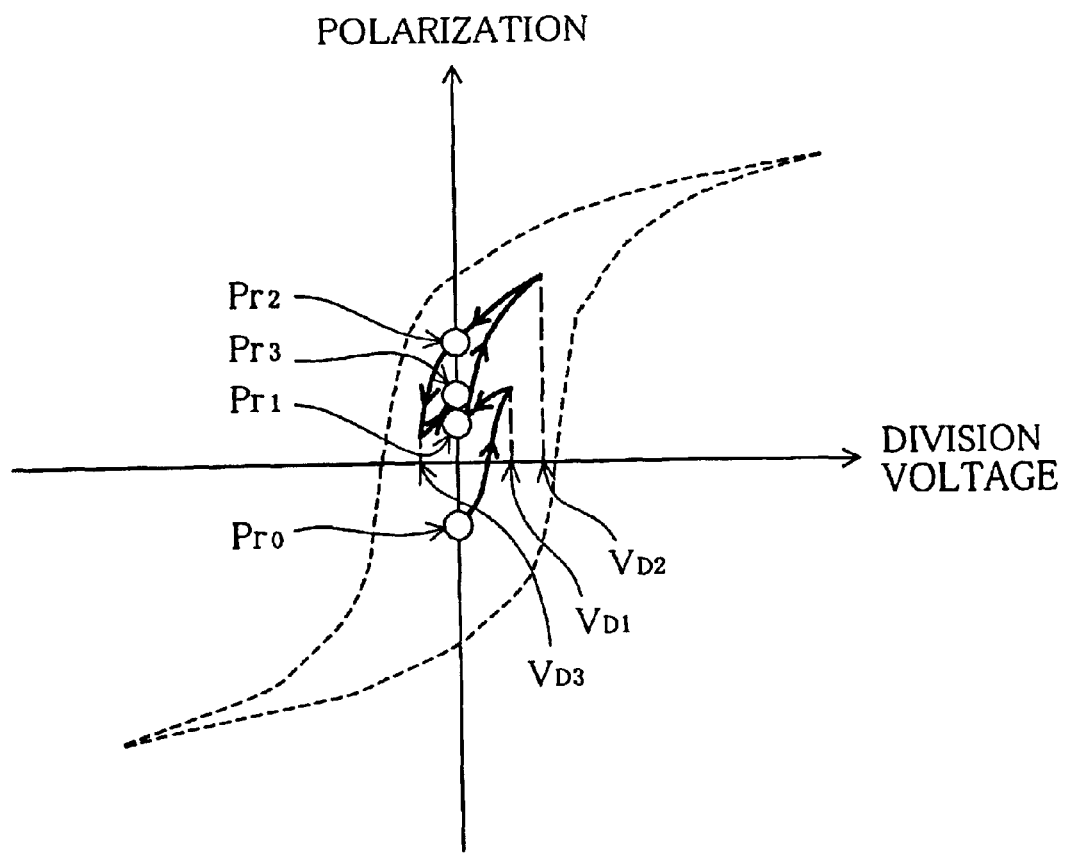
FIG. 14 is a view showing a history of a voltage applied to a ferroelectric capacitor and polarization when a weight is varied without application of a reset voltage, in the neural network system of the present invention.

FIG. 14 is a view showing a history of a voltage applied to the ferroelectric capacitor and a history of polarization in the case where the weight is varied without application of the reset voltage.

Referring to FIG. 14, first of all, when residual polarization in an initial stage is assumed to be Pr0, it varies into Pr1 by applying the division voltage $V_{D1}$ calculated by the method of varying weight slightly. Then, upon application of the division voltage $V_{D2}$ calculated in the same manner, the residual polarization Pr1 varies into Pr2. Upon application of the division voltage $V_{D3}$ with reversed polarity as a calculation result, the residual polarization decreases and varies into Pr3. Under the condition in which the reset voltage is not applied, polarization of the ferroelectric varies in the manner described above.

At the time point of completion of the learning of the neural network system, the remaining weight data is a final weight (weight corresponding to the final residual polarization), and this reflects the application history. Therefore, there is no method to restore an accurate polarization value.

Accordingly, the inventors have studied intensively, and have conceived that, after the learning is made to converge by continuously applying a weight value without applying a reset voltage, the weight of each synapse (multiplier) is varied by applying the reset pulse. In addition, the inventors have found that, the weight voltage $V_w$ at which the sum of errors becomes minimum is determined uniquely as an optimal weight voltage, by selecting one of the synapses and by varying the weight voltage $V_w$ of the selected synapse after causing the learning to converge without applying the reset voltage.

Based on this concept, a learning method capable of reproducing the weight voltage at the time when the learning finally converges while reducing the number of times the reset voltage is applied to all the synapses, has been conceived, and will be described below.

Figure 15:
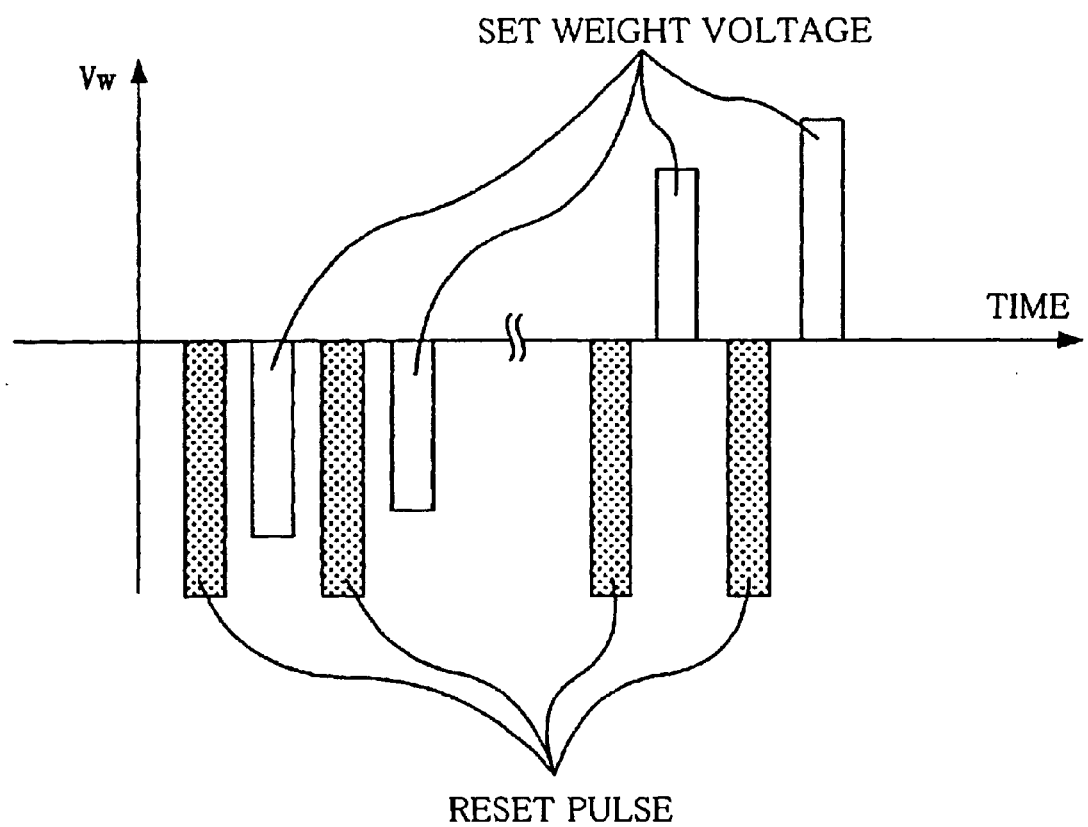
FIG. 15 is a view for explaining a learning method of a neural network system according to a fifth embodiment of the present invention.
Figure 16:
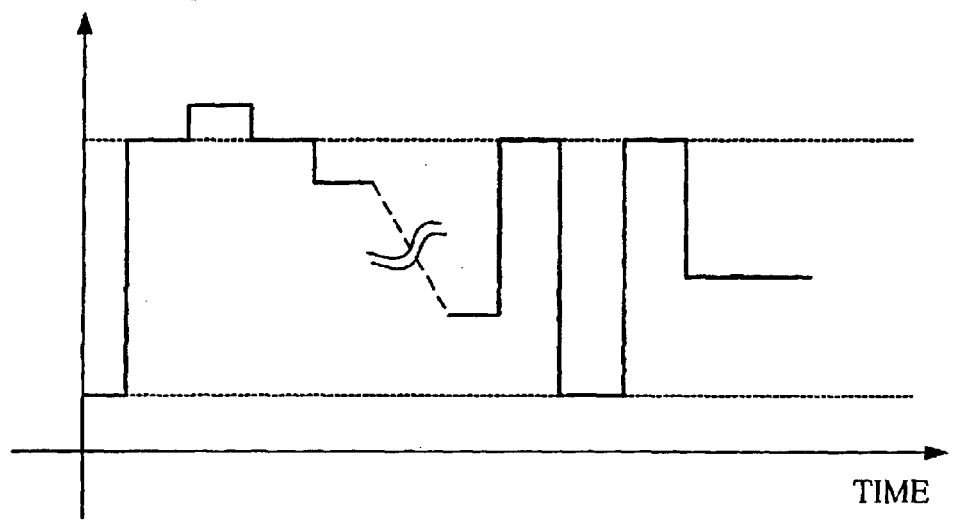
FIG. 16 is a view showing variation in sum of errors in the learning method in FIG. 15.

FIG. 15 is a view for explaining the learning method of the neural network system of this embodiment and FIG. 16 is a view showing variation in sum of errors in the learning method in FIG. 15.

FIG. 15 shows an operation in obtaining data for reproducing an optimal weight value after the learning operation of the neural network system has converged. In the learning method of this embodiment, the learning is made to converge without applying the reset pulse.

Specifically, the weight voltage $V_w$ corresponding to the weight calculated according to the formulae (8) and (9) is applied without the reset pulse. Since the ferroelectric has a hysteresis characteristic, a value different from a target $V_{FG}$ is held. But, the learning direction (increase or decrease in weight) is the same, and therefore, the learning converges in time after repetition. Thereby, a held $V_{FG}$ group is a voltage value group obtained from completion of the learning. But, the value of $V_{FG}$ cannot be detected from outside.

Accordingly, as shown in FIG. 15, under the condition in which the learning is completed and has converged, after the reset pulse (pulse with the division voltage $V_D$ being reset voltage $V_{res}$) is applied to one selected synapse, the weight voltage $V_w$ (weight voltage for search, and hence division voltage VD) is applied to this synapse. At this time, when the reset pulse is a negative voltage, the weight voltage $V_w$ being applied gradually increases from a voltage value of the reset pulse. The voltage being varied (increased) slightly, is, for example, the weight voltage corresponding to the slight weight Δw of the fourth embodiment. The voltage being applied to unselected synapses is 0V, and the voltage due to residual polarization of the ferroelectric is held in the FG electrode of each synapse.

In this procedure, every time the weight voltage $V_w$ is applied, the input/output patterns are all changed and the sum of errors ΣEp is calculated. Pairs of the applied weight voltages $V_w$ and the sum of errors are stored in the memory and the value of the weight voltage $V_w$ at which the sum of errors becomes smallest, is obtained. This value becomes an optimal value of the weight voltage to be applied to the synapse after reset. Thereafter, the weight voltage with the optimal value is applied to the synapse after reset.

Then, by carrying out the operation after completion of learning which has been described above, for all the synapses, an optimal value vector of the weight voltage to be applied after reset (in other words, an optimal weight value vector to be written after reset) is obtained.

The weight voltage value thus obtained is a weight voltage value to be accurately restored if the weight voltage is applied after applying the reset pulse to the synapse, and therefore, such a weight voltage value can be satisfactorily reproduced.

The learning method of the above embodiment advantageously reduces learning time, because the reset operation is not performed at the convergence operation of learning. Since the operation for converting the weight voltage value to be reproducible is conducted after the learning, scanning is conducted once for all the synapses, and therefore, the number of times reset is performed is made less than that of the learning method of the third embodiment.

Specifically, in the fourth embodiment, since the reset operation is performed in learning, the voltage is applied to one synapse twice, i.e., the reset voltage and the weight voltage are applied to the synapse. On the other hand, in accordance with the learning method of this embodiment, the number of times the voltage is applied can be reduced to ½, because the reset is not performed in learning. Thereafter, an optimal weight value is obtained for each synapse. This is performed by one scanning. Therefore, the number of times reset is performed can be reduced and high-speed learning operation is achieved. It should be appreciated that, especially when there are many neuro units, the reset operation can be significantly reduced.

Since the allowable number of times the polarization of ferroelectric is inverted, is limited, for example, approximately $10^{15}$ in the status quo. Therefore, by reducing the number of times the reset is performed, the life of the system can be further extended.

As in the fourth embodiment, when the reset pulse is a positive voltage, the weight voltage to be applied in obtaining the weight value may be gradually decreased from a positive voltage side.

(Sixth Embodiment)

A learning method of a neural network system according to a sixth embodiment of the present invention is capable of further reducing the number of times reset operation is performed, by improving the learning method according to the fifth embodiment. Hereinafter, difference between the fifth embodiment and the sixth embodiment, will be described.

The reset operation for the synapse degrades the ferroelectric and requires time as described above, and therefore, it is desirable to minimize the number of times. Accordingly, the inventors of the present invention have studied to further lessen the reset operation based on the learning method of the fifth embodiment. Through the study, the inventors paid attention to a characteristic in which because the neural network system of the present invention is configured by an analog circuit, the output varies in analog by varying the weight in analog.

Figure 17:
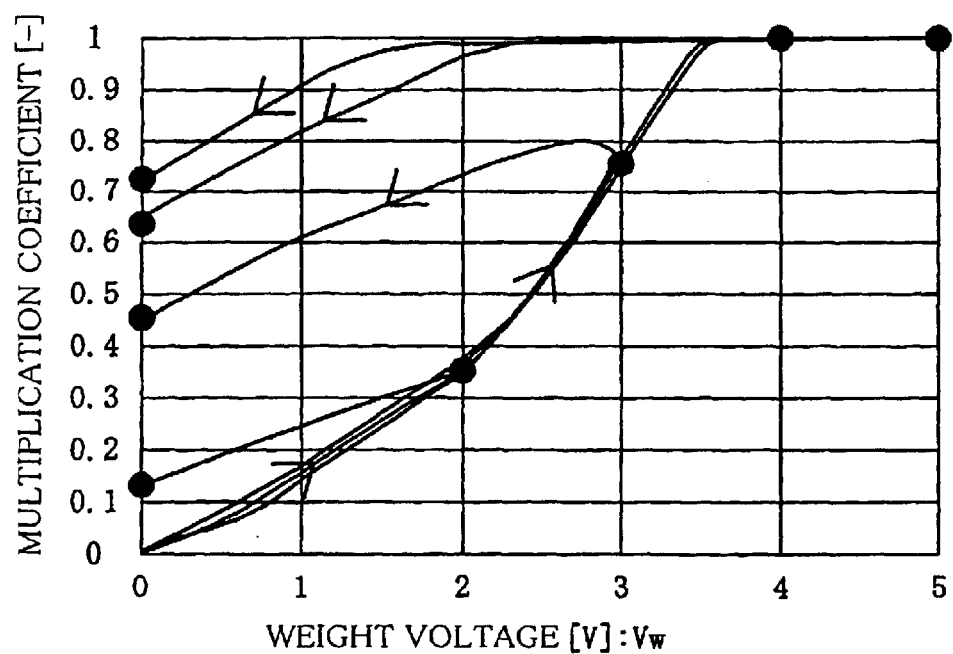
FIG. 17 is a view showing variations in multiplication coefficients in the case where a weight voltage is swept after a reset pulse is applied, in the neural network system of the present invention.
Figure 18:
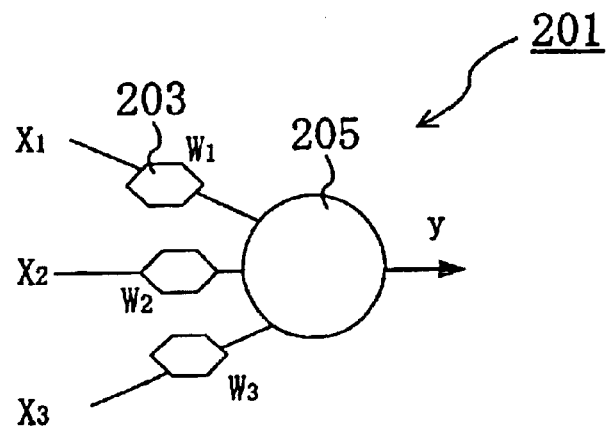
FIG. 18 is a view showing a device as a minimum unit in neural network data processing.
Figure 19:
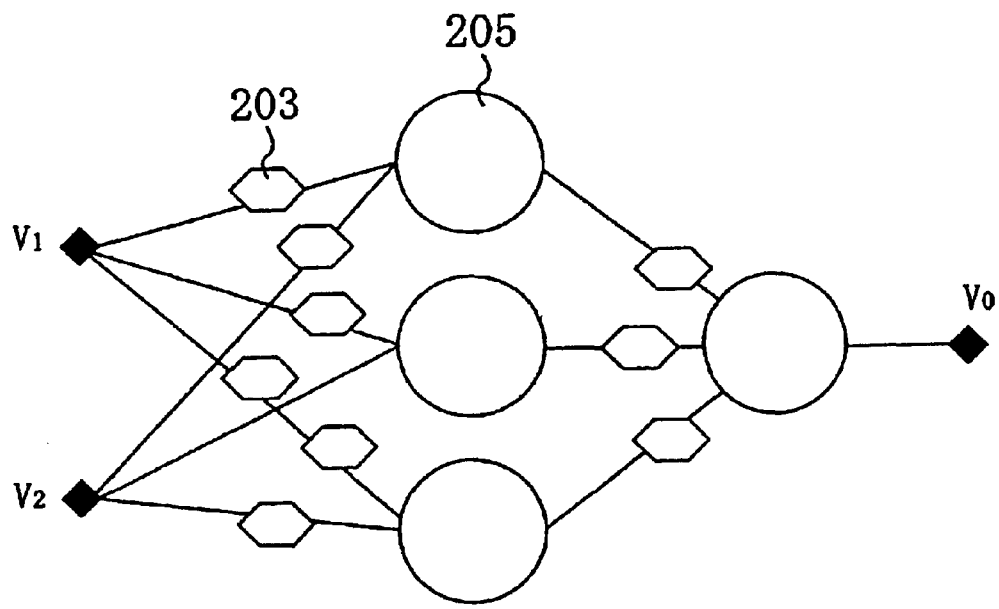
FIG. 19 is a view for explaining the neural network data processing.
Figure 20:
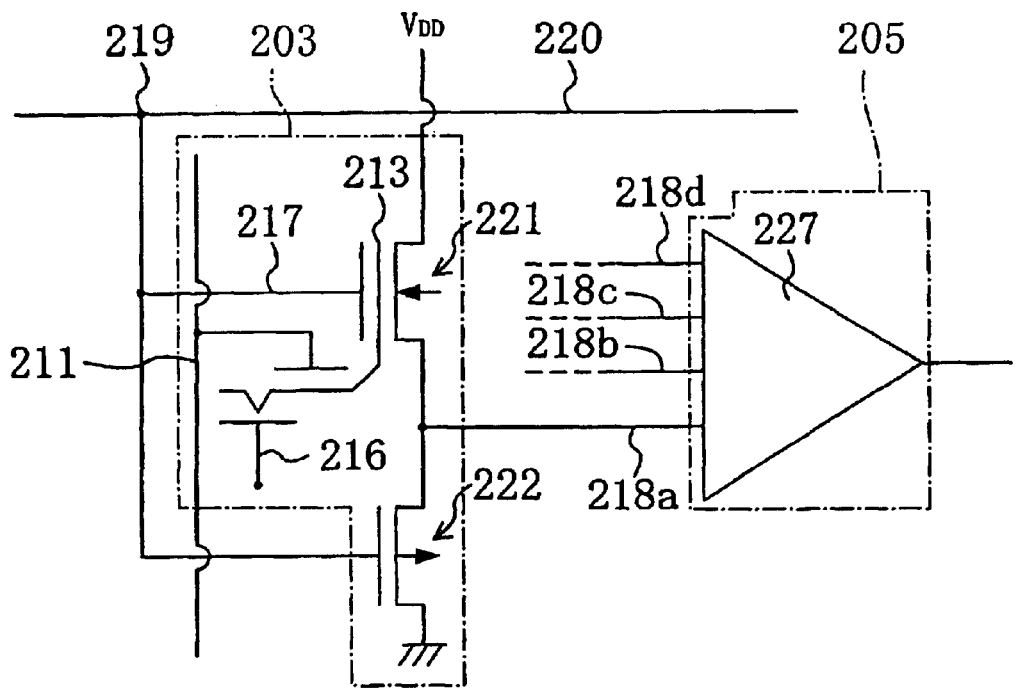
FIG. 20 is a circuit diagram showing the conventional neural network system.

FIG. 17 is a view showing a measurement result of variation in multiplication coefficients occurring when the weight voltage is swept after applying a reset pulse at −15[V], in the neural network system of the present invention.

As shown in FIG. 17, in the neural network system of the present invention, as the weight voltage is gradually increased, the multiplication coefficient increases from 0 to 1. But, thereafter, by removing the weight voltage, charge induced in the FG electrode is reduced by a normal dielectric component of the ferroelectric, and as a result, the multiplication coefficient decreases.

The inventors have discovered that, by increasing the weight voltage in analog (continuously) and by removing the weight voltage (stopping application of the voltage) at a point, the weight (and multiplication coefficient) to be held always becomes smaller than the weight during application of a maximum weight voltage. In actuality, the variation in the multiplication coefficient sometimes exhibits complex behavior by a variation in capacitance or the like caused by variation in thickness of a depletion layer of the MIS transistor. But, in that case, the multiplication coefficient becomes smaller after the weight voltage has been removed.

Furthermore, the inventors have conceived a method of significantly reducing weight restoring steps by applying such a property of the ferroelectric.

The steps of a weight restoring operation of this embodiment is carried out as described below. The steps (t) to (x) below are performed after the learning operation described in the fifth embodiment has converged.

(t) One synapse for obtaining data of the weight value is selected and the reset pulse is applied to the synapse.

(u) The weight voltage is increased continuously from the voltage of the reset pulse, and at the same time, a value of the sum of errors is measured and calculated. In actuality, since the sum of errors is calculated by switching the input/output pattern, it is desirable to obtain the output, after some transient response time lapses after application of the weight voltage, for example, after wait time of 100 nsec.

(v) A value of the weight voltage $V_{wo}$ at which the error becomes minimum under the condition in which the weight voltage in the step (u) is being applied is obtained.

(w) As in the fifth embodiment, the weight voltage $V_w$ is applied in the form of step starting from the weight voltage $V_{wo}$, including the reset operation, and the value of the weight voltage $V_w$ at which the sum of errors becomes minimum at a hold point (condition in which the weight voltage $V_w$ is not applied) is obtained. When the weight voltage value at which the sum of errors becomes minimum has been obtained, application of the weight voltage $V_w$ is completed and transition to the obtaining operation of the weight data for another synapse takes place, thus reducing the operation time.

(x) The above described steps (t) to (w) are carried out for all the synapses.

In the learning method of the fifth embodiment, the weight is varied stepwisely from a minimum value to a maximum value which can be set as the weight. On the other hand, in accordance with the learning method of this embodiment, since in the vicinity of the minimum error, the optimal value can be searched stepwisely from a weight value smaller than the weight from which the smallest error is always obtained, the number of times the reset operation is performed can be significantly reduced.

In accordance with the learning method of this embodiment, the life of the ferroelectric can be significantly extended, and the learning time of the neural network system can be greatly reduced.

In the learning method of this embodiment, the reset pulse is a negative voltage. When the reset pulse is a positive voltage, the same effects are obtained by varying the weight value toward a low voltage side therefrom.

Numerous modifications and alternative embodiments of the invention will be apparent to those skilled in the art in the light of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

What is claimed is:

1. A learning method of a semiconductor device comprising a neuro device having a multiplier as a synapse in which a weight varies according to an input weight voltage, and functioning as a neural network system that processes analog data, the learning method comprising:

a step A of inputting predetermined input data to the neuro device and calculating an error between a target value of an output of the neuro device with respect to the input data and an actual output;

a step B of calculating variation amount in the error by varying the weight of the multiplier thereafter; and a step C of varying the weight of the multiplier based on the variation amount in the error, wherein in the steps B and C, after inputting a reset voltage for setting the weight to a substantially constant value to the multiplier as the weight voltage, the weight is varied by inputting the weight voltage corresponding to the weight to be varied.

2. The learning method of a semiconductor device according to claim 1, wherein an absolute value of the weight voltage corresponding to the weight to be varied is smaller than an absolute value of the reset voltage.

3. The learning method of a semiconductor device according to claim 1, wherein a waveform of the reset voltage is pulse-shaped.

4. The learning method of a semiconductor device according to claim 1, wherein the steps A to C are carried out for a multiplier different from the multiplier.

5. The learning method of a semiconductor device according to claim 4, wherein the steps A to C are carried out for each multiplier in such a manner that the steps A to C are sequentially repeated, until the error becomes below a predetermined value.

6. The learning method of a semiconductor device according to claim 1, wherein variation in the weight of the multiplier with respect to the weight voltage has hysteresis characteristic.

7. The learning method of a semiconductor device according to claim 6, wherein an absolute value of the reset voltage is larger than an absolute value of a saturation voltage in the hysteresis characteristic.

8. The learning method of a semiconductor device according to claim 6, wherein the multiplier has ferroelectric capacitor in which the weight voltage is applied to one electrode thereof, and the weight is determined according to a potential of the other electrode of the ferroelectric capacitor.

* * * * *